(12) United States Patent
Kim et al.

(10) Patent No.: US 12,169,615 B2
(45) Date of Patent: Dec. 17, 2024

(54) DISPLAY DEVICE CAPABLE OF SENSING USER INPUT

(71) Applicant: SAMSUNG DISPLAY CO., LTD., Yongin-si (KR)

(72) Inventors: Miyoung Kim, Hwaseong-si (KR); Soyeon Park, Yongin-si (KR); Yong-Hwan Park, Hwaseong-si (KR); Sanghyun Jun, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/187,312

(22) Filed: Mar. 21, 2023

(65) Prior Publication Data

US 2023/0305664 A1    Sep. 28, 2023

(30) Foreign Application Priority Data

Mar. 22, 2022  (KR) .................. 10-2022-0035587

(51) Int. Cl.
    *G06F 3/045*    (2006.01)
    *G06F 3/041*    (2006.01)
    (Continued)

(52) U.S. Cl.
    CPC .......... *G06F 3/0445* (2019.05); *G06F 3/0412* (2013.01); *G06F 3/04164* (2019.05);
    (Continued)

(58) Field of Classification Search
    CPC .. G06F 3/0445; G06F 3/0446; G06F 3/04164; H10K 59/40
    (Continued)

(56) References Cited

U.S. PATENT DOCUMENTS 10,795,472 B2   10/2020  Beak et al.
10,838,565 B2   11/2020  Miyamoto et al.
(Continued)

FOREIGN PATENT DOCUMENTS

CN   113268164    8/2021
JP     6901888    7/2021
KR  10-2330864   11/2021

OTHER PUBLICATIONS

EESR dated Mar. 8, 2023 in corresponding EP Patent No. 23161827.3.

*Primary Examiner* — Jonathan M Blancha
(74) *Attorney, Agent, or Firm* — F. Chau & Associates, LLC

(57) ABSTRACT

Provided is a display device including a display panel including a display region and a non-display region, and an input sensing device disposed on the display panel. The input sensing device includes a first sensing insulation layer directly disposed on the display panel, a first sensing conductive layer disposed on the first sensing insulation layer, a second sensing insulation layer disposed on the first sensing insulation layer and covering the first sensing conductive layer, and a second sensing conductive layer disposed on the second sensing insulation layer. The second sensing insulation layer includes an organic film, and a first thickness of the first sensing conductive layer is greater than a second thickness of the second sensing conductive layer.

19 Claims, 14 Drawing Sheets

(51) Int. Cl.
*G06F 3/044* (2006.01)
*H10K 59/40* (2023.01)
*H10K 102/00* (2023.01)

(52) U.S. Cl.
CPC .......... *G06F 3/0446* (2019.05); *H10K 59/40* (2023.02); *G06F 2203/04102* (2013.01); *H10K 2102/311* (2023.02)

(58) Field of Classification Search
USPC ........................................................ 345/174
See application file for complete search history.

(56) References Cited

U.S. PATENT DOCUMENTS

| | | | | |
|---|---|---|---|---|
| 2008/0068525 | A1* | 3/2008 | Ishii | G02F 1/136209 |
| | | | | 349/44 |
| 2010/0295819 | A1* | 11/2010 | Ozeki | G06F 3/0443 |
| | | | | 174/250 |
| 2014/0217373 | A1* | 8/2014 | Youn | H10K 59/805 |
| | | | | 438/23 |
| 2016/0172623 | A1* | 6/2016 | Lee | H10K 50/84 |
| | | | | 257/40 |
| 2016/0282992 | A1* | 9/2016 | Song | G06F 3/0446 |
| 2017/0025480 | A1* | 1/2017 | Chiang | H10K 59/40 |
| 2017/0115770 | A1* | 4/2017 | Han | G06F 3/0446 |
| 2019/0187840 | A1* | 6/2019 | Esaka | G06F 1/169 |
| 2021/0026473 | A1 | 1/2021 | Kim et al. | |
| 2021/0191570 | A1 | 6/2021 | Cui et al. | |
| 2021/0200363 | A1 | 7/2021 | Lee et al. | |
| 2021/0225944 | A1* | 7/2021 | Li | G06F 3/0412 |
| 2021/0365155 | A1 | 11/2021 | Kim et al. | |
| 2022/0028935 | A1 | 1/2022 | Park et al. | |

\* cited by examiner

DISPLAY DEVICE CAPABLE OF SENSING USER INPUT

CROSS-REFERENCE TO RELATED APPLICATIONS

This U.S. non-provisional patent application claims priority under 35 U.S.C. § 119 of Korean Patent Application No. 10-2022-0035587, filed on Mar. 22, 2022, the entire disclosure of which is incorporated by reference herein.

TECHNICAL FIELD

The present disclosure herein relates to a display device, and more particularly, to a display device capable of sensing user inputs that can be manufactured with less processing steps.

DISCUSSION OF RELATED ART

An electronic device which provides images to a user, such as a smart phone, a digital camera, a notebook computer, a GPS, and a television, includes a display device for displaying the images. The display device may include a display panel which generates and displays images, and an input device such as a keyboard, a mouse, or an input sensing unit for sensing user inputs such as touches by a user of a surface of the display device.

The input sensing unit is disposed on the display panel and includes a touch panel. When the user touches the touch panel, an input signal is generated. The input signal generated from the touch panel is provided to the display panel, and the display panel may provide an image corresponding to the input signal in response to the input signal provided from the touch panel.

However, present manufacturing technology includes several complex steps that increases costs and may result in defects that reduce reliability of a display device that includes an input sensing unit. While removal of a layer of the display device could reduce the number of manufacturing steps, such removal may result in a short circuit within the input sensing unit that reduces reliability.

SUMMARY

The present disclosure may provide a display device with increased reliability by simplifying process steps for the formation of an input sensing unit, thereby reducing process costs and time, and by preventing the occurrence of short circuits of electrodes and lines included in the input sensing unit.

An embodiment of the inventive concept provides a display device including a display panel having a display region and a non-display region, and an input sensing device disposed on the display panel. The input sensing device includes a first sensing insulation layer directly disposed on the display panel, a first sensing conductive layer disposed on the first sensing insulation layer, a second sensing insulation layer disposed on the first sensing insulation layer and covering the first sensing conductive layer, and a second sensing conductive layer disposed on the second sensing insulation layer. The second sensing insulation layer includes an organic film, and a first thickness of the first sensing conductive layer is greater than a second thickness of the second sensing conductive layer.

In an embodiment, the first thickness may be approximately 1.5 times to approximately 4.0 times the second thickness.

In an embodiment, the first thickness may be approximately 2000 Å to approximately 4000 Å, and the second thickness may be approximately 700 Å to approximately 1500 Å.

In an embodiment, an upper surface of the second sensing conductive layer may define an uppermost surface of the input sensing unit.

In an embodiment, the input sensing device may include a plurality of sensing patterns overlapping the display region, and arranged in a plurality of rows and a plurality of columns, a plurality of sensing pads overlapping the non-display region, and a plurality of sensing lines connecting the plurality of sensing patterns and the plurality of sensing pads, respectively, wherein the plurality of sensing patterns are included in the first sensing conductive layer.

In an embodiment, the input sensing device may further include a plurality of connection patterns connecting adjacent sensing patterns among the plurality of sensing patterns, wherein the plurality of connection patterns are included in the second sensing conductive layer.

In an embodiment, a length of the plurality of connection patterns on a plane may be approximately 5 mm or less.

In an embodiment, the input sensing device may include a first non-bending region overlapping the display region; a second non-bending region opposing the first non-bending region; and a bending region disposed between the first non-bending region and the second non-bending region and having a predetermined radius of curvature, and each of the plurality of sensing lines may include a first portion disposed in the first non-bending region, and a second portion disposed in the bending region and connected to the first portion, wherein the first portion may be included in the first sensing conductive layer, and the second portion may be included in the second sensing conductive layer.

In an embodiment, the input sensing device may further include a dummy line disposed adjacent to the second portion of each of the plurality of sensing lines, wherein the dummy line is included in the second sensing conductive layer.

In an embodiment, the second portion may be disposed in a central portion of the bending region, and the dummy line may be disposed at an outer periphery portion of the bending region.

In an embodiment, the display device may further include a bending protective layer overlapping the bending region, and covering at least a portion of the second portion.

In an embodiment, a width of the second portion may be greater than a width of the first portion.

In an embodiment, a pad contact hole exposing at least some of the plurality of sensing pads may be defined in the second sensing insulation layer, and the second portion may be electrically connected to the plurality of sensing pads through the pad contact hole.

In an embodiment, one side spaced apart from the bending region may be defined in the second non-bending region, and an end of the second sensing insulation layer may be aligned with the one side of the second non-bending region.

In an embodiment, an electrode contact hole exposing at least a portion of the first sensing conductive layer, and overlapping the display region may be defined in the second sensing insulation layer, and the second sensing conductive layer may be electrically connected to the first sensing conductive layer through the electrode contact hole.

In an embodiment of the inventive concept, a display device includes a display panel having a display region and a non-display region, and an input sensing device disposed on the display panel, and including a first non-bending region overlapping the display region; a second non-bending region opposing the first non-bending region; a bending region disposed between the first non-bending region and the second non-bending region and having a predetermined radius of curvature; a first sensing insulation layer directly disposed on the display panel, a first sensing conductive layer disposed on the first sensing insulation layer; a second sensing insulation layer disposed on the first sensing insulation layer and covering the first sensing conductive layer; a second sensing conductive layer disposed on the second sensing insulation layer; a plurality of sensing electrodes overlapping the display region, and arranged in a plurality of rows and a plurality of columns; a plurality of sensing pads overlapping the non-display region; a plurality of sensing lines connecting the plurality of sensing electrodes and the plurality of sensing pads, respectively; and a dummy line disposed adjacent to some of the plurality of sensing lines.

In an embodiment, each of the plurality of sensing lines may include a first portion disposed in the first non-bending region, and included in the first sensing conductive layer, and a second portion disposed in the bending region and included in the second sensing conductive layer, wherein the dummy line is included in the second sensing conductive layer, and disposed adjacent to the second portion.

In an embodiment, an upper surface of the second sensing conductive layer may define an uppermost surface of the input sensing unit.

In an embodiment, the plurality of sensing electrodes may include a plurality of sensing patterns arranged in the plurality of rows and the plurality of columns, and a plurality of connection patterns connecting adjacent sensing patterns among the plurality of sensing patterns, wherein the plurality of connection patterns may be included in the second sensing conductive layer.

In an embodiment, a length of the plurality of connection patterns on a plane may be approximately 5 mm or less.

An embodiment of the inventive concept provides a display device including a display panel having a display region and a non-display region, and an input sensing device disposed on the display panel. The input sensing device includes a first sensing insulation layer directly disposed on the display panel, a first sensing conductive layer disposed on the first sensing insulation layer, a second sensing insulation layer disposed on the first sensing insulation layer and covering the first sensing conductive layer, and a second sensing conductive layer disposed on the second sensing insulation layer, wherein an upper surface of the second sensing conductive layer defines an uppermost surface of the input sensing unit.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
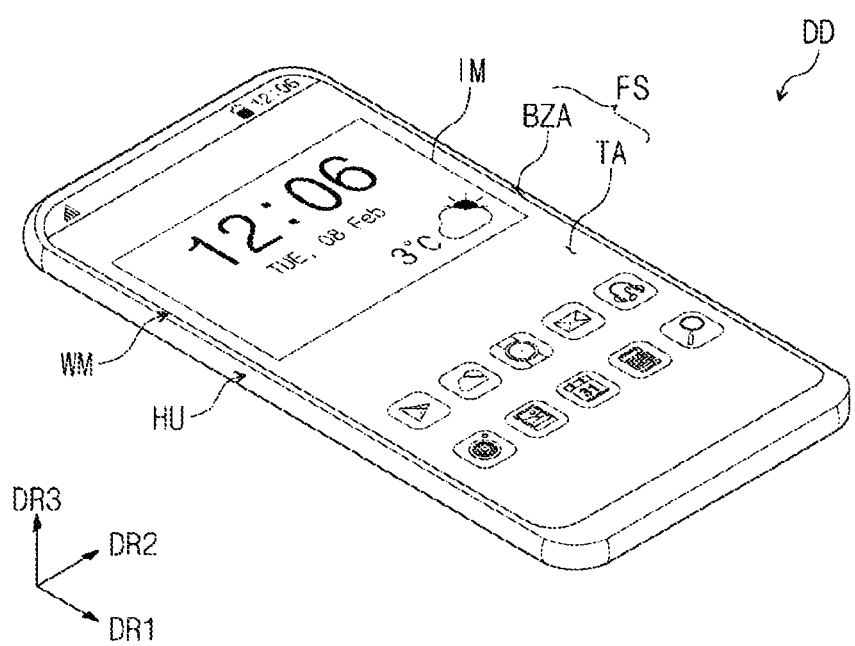
FIG. 1A is a coupling perspective view of a display device according to an embodiment of the inventive concept.

Hereinafter, embodiments of the inventive concept will be described with reference to the accompanying drawings.

In the present disclosure, when an element (or an area, a layer, a portion, etc.) is referred to as being "on," "connected to," or "coupled to" another element, it means that the element may be directly connected to/coupled to the other element, or that a third element may be disposed therebetween.

Like reference numerals refer to like elements. Additionally, it is to be understood that in the drawings, the relative thicknesses, proportions, angles, and dimensions of components are intended to be drawn to scale for at least one embodiment of the present disclosure, however, changes may be made to these characteristics within the scope of the present disclosure and the present inventive concept is not necessarily limited to the properties. The term "and/or" includes any and all combinations of one or more of which associated elements may define.

It will be understood that, although the terms "first," "second," etc., may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of components shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

In the present disclosure, being "directly disposed" may mean that there is no layer, film, region, plate, or the like added between a portion of a layer, a film, a region, a plate, or the like and other portions. For example, being "directly disposed" may mean being disposed without additional members such as an adhesive member between two layers or two members.

Hereinafter, a display device according to an embodiment of the inventive concept will be described with reference to the accompanying drawings.

Figure 1B:
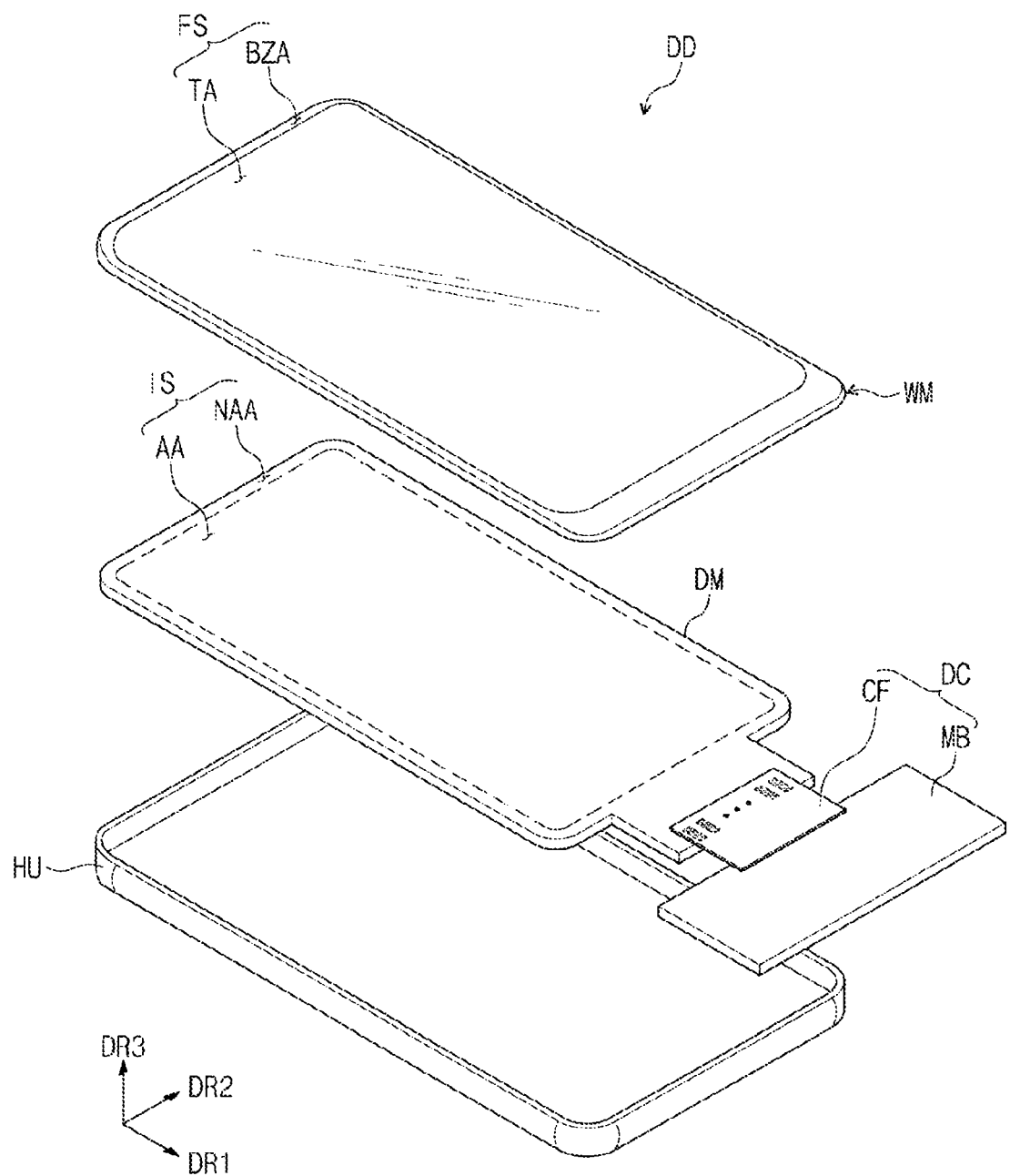
FIG. 1B is an exploded perspective view of a display device according to an embodiment of the inventive concept.
Figure 2A:
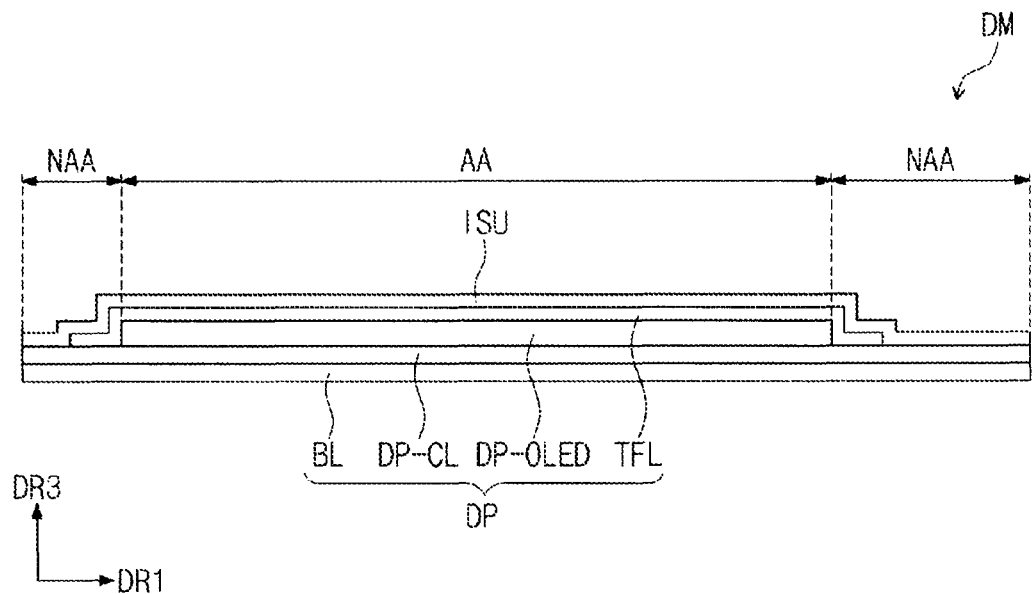
FIG. 2A is a cross-sectional view of a display module according to an embodiment of the inventive concept.
Figure 2B:
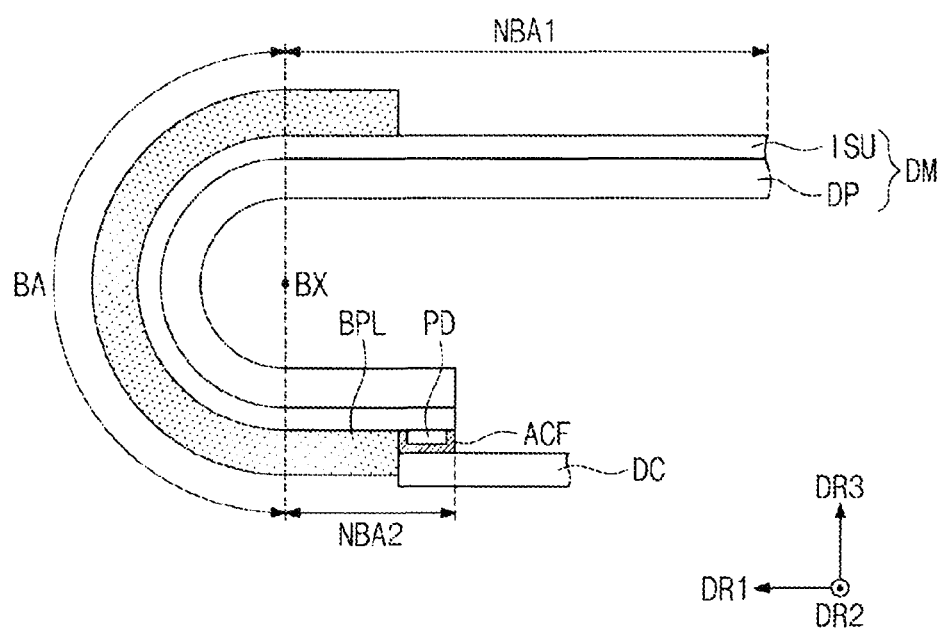
FIG. 2B is a cross-sectional view showing some components of a display device according to an embodiment of the inventive concept.

FIG. 1A is a coupling perspective view of a display device according to an embodiment of the inventive concept. FIG. 1B is an exploded perspective view of a display device according to an embodiment of the inventive concept. FIG. 2A is a cross-sectional view of a display module according to an embodiment of the inventive concept. FIG. 2B is a cross-sectional view showing some components of a display device according to an embodiment of the inventive concept.

Referring to FIG. 1A, a display device DD may be a device activated according to an electrical signal. The display device DD may display an image IM and sense an external input. The display device DD may include various embodiments. For example, the display device DD may include a tablet computer, a laptop, a computer, a smart television, and the like. In the present embodiment, the display device DD is exemplarily illustrated as a smart phone.

The display device DD may display the image IM toward a third direction DR3 on a display surface FS parallel to each of a first direction DR1 and a second direction DR2. The display surface FS on which the image IM is displayed may correspond to a front surface of the display device DD, and may correspond to a front surface FS of the window member WM. Hereinafter, the same reference numeral will be used for the display surface and the front surface of the display device DD, and for the front surface of the window member WM. The image IM may include both a moving image and a still image. In FIG. 1A, as an example of the image IM, a watch and a plurality of icons are illustrated.

In the present embodiment, a front surface (or an upper surface) and a back surface (or a lower surface) of each member are defined on the basis of a direction in which the image IM is displayed. The front surface and the rear surface oppose each other in the third direction DR3 and the normal direction of each of the front surface and the rear surface may be parallel to the third direction DR3. The separation distance between the front surface and the rear surface in the third direction DR3 may correspond to the thickness of the display panel DP in the third direction DR3. Meanwhile, directions indicated by the first to third directions DR1, DR3, and DR3 are a relative concept, and may be changed to different directions. Hereinafter, first to third directions are directions indicated by the first to third directions DR1, DR2, and DR3, respectively, and are given the same reference numerals. In addition, in the present disclosure, "on a plane" or "in a plan view" may mean when viewed in the third direction DR3.

The display device DD according to an embodiment of the inventive concept may sense a user input applied from the outside. The user input includes various forms of external inputs such as a part of a user's body, light, heat, or pressure. The user input may be provided in various forms, and the display device DD may sense the user input applied to a side surface or a rear surface of the display device DD depending on the structure of the display device DD, but embodiments of the inventive concept are not limited to any one embodiment.

As illustrated in FIG. 1A and FIG. 1B, the display device DD includes a window member WM, a display module DM, a driving circuit DC, and an external case HU. In the present embodiment, the window member WM and the external case HU are coupled together to constitute the illustrated device DD. In the present embodiment, the external case HU, the display module DM, and the window member WM may be sequentially laminated along the third direction DR3.

The window member WM may include an optically transparent material. The window member WM may include an insulation panel. For example, the window member WM may be composed of glass, plastic, or a combination thereof.

The front surface FS of the window member WM defines the front surface of display device DD as described above. A transmissive region TA may be an optically transparent region. For example, the transmissive region TA may be a region having a visible light transmittance of about 90% or higher.

A bezel region BZA may be a region having a relatively low light transmittance compared to the transmissive region TA. The bezel region BZA defines the shape of the transmissive region TA. The bezel region BZA may be adjacent to the transmissive region TA, and may surround the transmissive region TA.

The bezel region BZA may have a predetermined color. The bezel region BZA may cover a peripheral region NAA of the display module DM to block the peripheral region NAA from being viewed from the outside. In the window member WM according to an embodiment of the inventive concept, the bezel region BZA may be omitted.

The display module DM may display the image IM and may sense an external input. The image IM may be displayed on a front surface IS of the display module DM. The front surface IS of the display module DM includes an active region AA and a peripheral region NAA. The active region AA may be a region activated by an electrical signal.

In the present embodiment, the active region AA may be a region in which the image IM is displayed, and at the same time, may be a region in which the external input is sensed. The transmissive region TA overlaps at least the active region AA. For example, the transmissive region TA overlaps a front surface or at least a portion of the active region AA. Accordingly, a user may visually recognize the image IM through the transmissive region TA, or may provide an external input. In the active area AA, a region in which the image IM is displayed and a region in which an external input is sensed may be separated from each other, but embodiments of the inventive concept are not limited thereto.

The peripheral region NAA may be a region covered by the bezel area BZA. The peripheral region NAA is adjacent to the active region AA. The peripheral region NAA may surround the active region AA. In the peripheral region NAA, a driving circuit, or a driving line for driving the active region AA may be disposed.

The display module DM may further include a display panel and an input sensing unit. The image IM may substantially be displayed on the display panel, and an external input may substantially be sensed by the input sensing unit. The display module DM includes both the display panel and the input sensing unit, and thus, may simultaneously display the image IM and sense an external input. A driving circuit DC may include a flexible circuit board CF and a main circuit board MB. The flexible circuit board CF may be electrically connected to the display module DM. The flexible circuit board CF may connect the display module DM and the main circuit board MB. The flexible circuit board CF according to the inventive concept might not be connected to the main circuit board MB, and the flexible circuit board CF may be a rigid substrate.

The flexible circuit board CF may be connected to pads of the display module DM disposed in the peripheral region NAA. The flexible circuit board CF may provide an electrical signal for driving the display module DM to the display module DM. The electrical signal may be generated in the flexible circuit board CF or in the main circuit board MB.

The main circuit board MB may include various driving circuits for driving the display module DM or connectors for supplying power, and the like. The main circuit board MB may be connected to the display module DM through the flexible circuit board CF.

Meanwhile, FIG. 1B exemplarily illustrates the display module DM in an unfolded state, but at least a portion of the display module DM may be bent. In the present embodiment, a portion of the display module DM connected to the main circuit board MB is bent toward the rear surface of the display module DM, so that the main circuit board MB may be assembled while overlapping the rear surface of the display module DM.

The external case HU is coupled to the window member WM and defines the appearance of the display device DD. The external case HU provides a predetermined internal space. The display module DM may be accommodated in the internal space.

The external case HU may include a material having a relatively high rigidity. For example, the external case HU may include glass, plastic, or a metal, or may include a plurality of frames and/or plates composed of a combination thereof. The external case HU may stably protect components of the display device DD which are accommodated in the internal space from an external impact.

Referring to FIG. 2B, the display module DM may include the display panel DP and an input sensing unit ISU. The display panel DP may be a component which substantially generates the image IM. The image IM (see FIG. 1A and FIG. 1B) generated by the display panel DP may be visually recognized by a user from the outside through the transmissive region TA (see FIG. 1A and FIG. 1B).

The display panel DP may be a light emission type display panel, but is not particularly limited thereto. For example, the display panel DP may be an organic light emission display panel or an inorganic light emission display panel. The organic light emission display panel may be a display panel in which a light emission layer includes an organic light emission material. The inorganic light emission display panel may be a display panel in which a light emission layer includes quantum dots, quantum rods, or micro-LEDs. Hereinafter, the display panel DP is described as an organic light emission display panel.

The input sensing unit ISU may be disposed on the display panel DP. The input sensing unit ISU may sense an external input applied from the outside. The external input may include various forms of inputs provided from the outside of the display device DD (see FIG. 1A). An external input applied from the outside may be provided in various forms. For example, the external input may include not only a contact by a part of a user's body, such as a hand, but also an external input applied in close proximity, or adjacent to the display device DD at a predetermined distance (for example, hovering). Also, the external input may have various forms such as force, pressure, and light, but is not limited to any one embodiment.

The input sensing unit ISU may be formed on the display panel DP through a continuous process. In this case, the input sensing unit ISU may be directly disposed on the display panel DP. Meanwhile, in the present disclosure, when "a component B is directly disposed on a component A" may mean that a third element is not disposed between the component A and the component B. For example, an adhesive layer may not be disposed between the input sensing unit ISU and the display panel DP.

The display panel DP may include a base layer BL, a circuit element layer DP-CL disposed on the base layer BL, a display element layer DP-OLED, and an upper insulation layer TFL.

The base layer BL may provide a base layer on which the circuit element layer DP-CL, the display element layer DP-OLED, and the upper insulation TFL are disposed. The base layer BL may be a rigid substrate, or a flexible substrate capable of bending, folding, rolling, and the like. The base layer BL may be a glass substrate, a metal substrate, a polymer substrate, or the like. However, embodiments of the inventive concept are not limited thereto, and the base layer BL may include an inorganic layer, an organic layer, or a composite material layer.

The base layer BL may have a multi-layered structure. For example, the base layer BL may include a first synthetic resin layer, a multi-layered or single-layered inorganic layer, and a second synthetic resin layer disposed on the multi-layered or single-layered inorganic layer. Each of the first and second synthetic resin layers may include a polyimide-based resin, but is not particularly limited thereto.

The circuit element layer DP-CL may be disposed on the base layer BL. The circuit element layer DP-CL may include a plurality of insulation layers, a plurality of conductive layers, and a semiconductor layer. The plurality of conductive layers of the circuit element layer DP-CL may constitute signal lines, or a control circuit of a pixel PX (see FIG. 4).

The display element layer DP-OLED may be disposed on the circuit element layer DP-CL. The display element layer DP-OLED may include organic light emission elements. However, this is only exemplary. The display element layer DP-OLED according to an embodiment of the inventive concept may include inorganic light emission elements, organic-inorganic light emission elements, or a liquid crystal layer.

The upper insulation layer TFL may include a capping layer and a thin film encapsulation film. The upper insulation layer TFL may include an organic layer and a plurality of insulation layers for encapsulating the organic layer.

The upper insulation layer TFL may be disposed on the display element layer DP-OLED, and may protect the display element layer DP-OLED from foreign substances such as moisture, oxygen, and dust particles. The upper insulation layer TFL may seal the display element layer DP-OLED to block moisture and oxygen introduced into the display element layer DP-OLED. The upper insulation layer TFL may include at least one insulation layer. The upper insulation layer TFL may include an organic layer and a plurality of insulation layers for encapsulating the organic layer. The upper insulation layer TFL may include a laminate structure of the order of inorganic layer/organic layer/inorganic layer.

The input sensing unit ISU is disposed on the upper insulation layer TFL. The input sensing unit ISU may be formed on the upper insulation layer TFL through a continuous process. The input sensing unit ISU may be directly disposed on the display panel DP. That is, a separate adhesive member might not be disposed between the input sensing unit ISU and the display panel DP. The input sensing unit ISU may be disposed to be in contact with an inorganic layer disposed at the uppermost portion of the upper insulation layer TFL.

The display module DM according to an embodiment of the inventive concept may further include a protective member disposed on a lower surface of the display panel DP, and an anti-reflection member disposed on an upper surface of the input sensing unit ISU. The anti-reflection member may reduce the reflectance of external light. The anti-reflection member may be directly disposed on the input sensing unit ISU through a continuous process.

The anti-reflection member may include a light blocking pattern overlapping a reflection structure disposed on a lower side of the anti-reflection member. The anti-reflection member may further include a color filter. The color filter is disposed between light blocking patterns, and may include a first filter of a first color, a second filter of a second color, and a third filter of a third color, respectively corresponding to a first color pixel, a second color pixel, and a third color pixel.

Referring to FIG. 2B, some regions of the display module DM may be bent. The display module DM may include a first non-bending region NBA1, a second non-bending region NBA2 spaced apart from the first non-bending region NBA1 in the first direction DR1, and a bending region BA defined between the first non-bending region NBA1 and the second non-bending region NBA2.

The bending region BA may be bent along a virtual bending axis BX extended in the second direction DR2. As illustrated in FIG. 2B, as the bending region BA is bent, the second non-bending region NBA2 is disposed in a lower portion of the first non-bending region NBA1, and may face the first non-bending region NBA1.

The driving circuit DC may be connected to the display module DM. For example, the driving circuit DC may be connected to one side of the second non-bending region NBA2 of the display module DM. The driving circuit DC may include a base layer, and a timing controller disposed on the base layer. The timing controller may be formed of an integrated circuit chip (IC), and mounted on an upper surface of the base layer. The driving circuit DC may be electrically connected to the display module DM through a pad unit PD included in the display module DM. The driving circuit DC may be electrically connected to the pad unit PD through an anisotropic conductive film ACF. The driving circuit DC includes a circuit pad, and the circuit pad may be electrically connected to the pad unit PD through the anisotropic conductive film ACF.

The bending region BA may be bent such that the second non-bending region NBA2 is disposed below the first non-bending region NBA1. Therefore, the driving circuit DC connected to the second non-bending region NBA2 may be disposed below the first non-bending region NBA1. That is, the first non-bending region NBA1 and the second non-bending region NBA2 may be disposed on different planes (or reference surfaces) from each other. The bending region BA may be bent to protrude in a horizontal direction on a cross-section. The bending region BA has a predetermined curvature and a predetermined radius of curvature. The radius of curvature may be about 0.1 mm to about 0.5 mm.

The display device DD may include a bending protective layer BPL disposed on the display module DM. The bending protective layer BPL may be disposed on the bending region BA of the display module DM. The bending protective layer BPL may perform a function of relaxing stress occurring due to the bending of the display panel DP.

The bending protective layer BPL may be bent together with the bending region BA. The bending protective layer BPL protects the bending region BA from an external impact, and control a neutral plane of the bending region BA. The bending protective layer BPL controls stress of the bending region BA such that the neutral plane becomes closer to signal lines disposed in the bending region BA.

The bending protective layer BPL may overlap at least the bending region BA. The bending protective layer BPL may overlap at least some of the first non-bending region NBA1, the bending region BA, and the second non-bending region NBA2. In an embodiment, the bending protective layer BPL may overlap only a portion of each of the first non-bending region NBA1 and the second non-bending region NBA2. The bending protective layer BPL my not overlap the above-described active region AA (see FIG. 2A). Meanwhile, FIG. 2B exemplarily illustrates that one side surface of the bending protective layer BPL is in contact with the driving circuit DC, but embodiments of the inventive concept are not limited thereto. For example, one side surface of the bending protective layer BPL may be disposed spaced apart from an edge of the driving circuit DC on a plane.

The bending protective layer BPL may overlap at least a portion of the driving circuit DC on a plane. The bending protective layer BPL may be disposed on one portion of the first non-bending region NBA1 adjacent to the bending region BA, and may be extended to the bending region BA and the second non-bending region NBA2 to cover the edge of the driving circuit DC coupled to the second non-bending region NBA2 of the display module DM. The bending protective layer BPL may not overlap the driving circuit DC on a plane.

The thickness of the bending protective layer BPL may be approximately 500 μm or less. For example, the thickness of the bending protective layer BPL may be approximately 10 μm to approximately 200 μm. When the thickness of the bending protective layer BPL satisfies the above range, durability and flexibility may be ensured without excessively increasing the total thickness of the bending protective layer BPL, so that the display device DD with further increased mechanical reliability may be implemented. Meanwhile, in the present disclosure, the thickness of the bending protective layer BPL may represent an average value of the thickness of the bending protective layer BPL provided on one surface of the display panel DP. The thickness of the bending protective layer BPL may be an arithmetic mean value of thickness values of the bending protective layer BPL measured with the shortest distance from a lower surface of the bending protective layer BPL to an upper surface of the bending protective layer BPL.

Figure 3A:
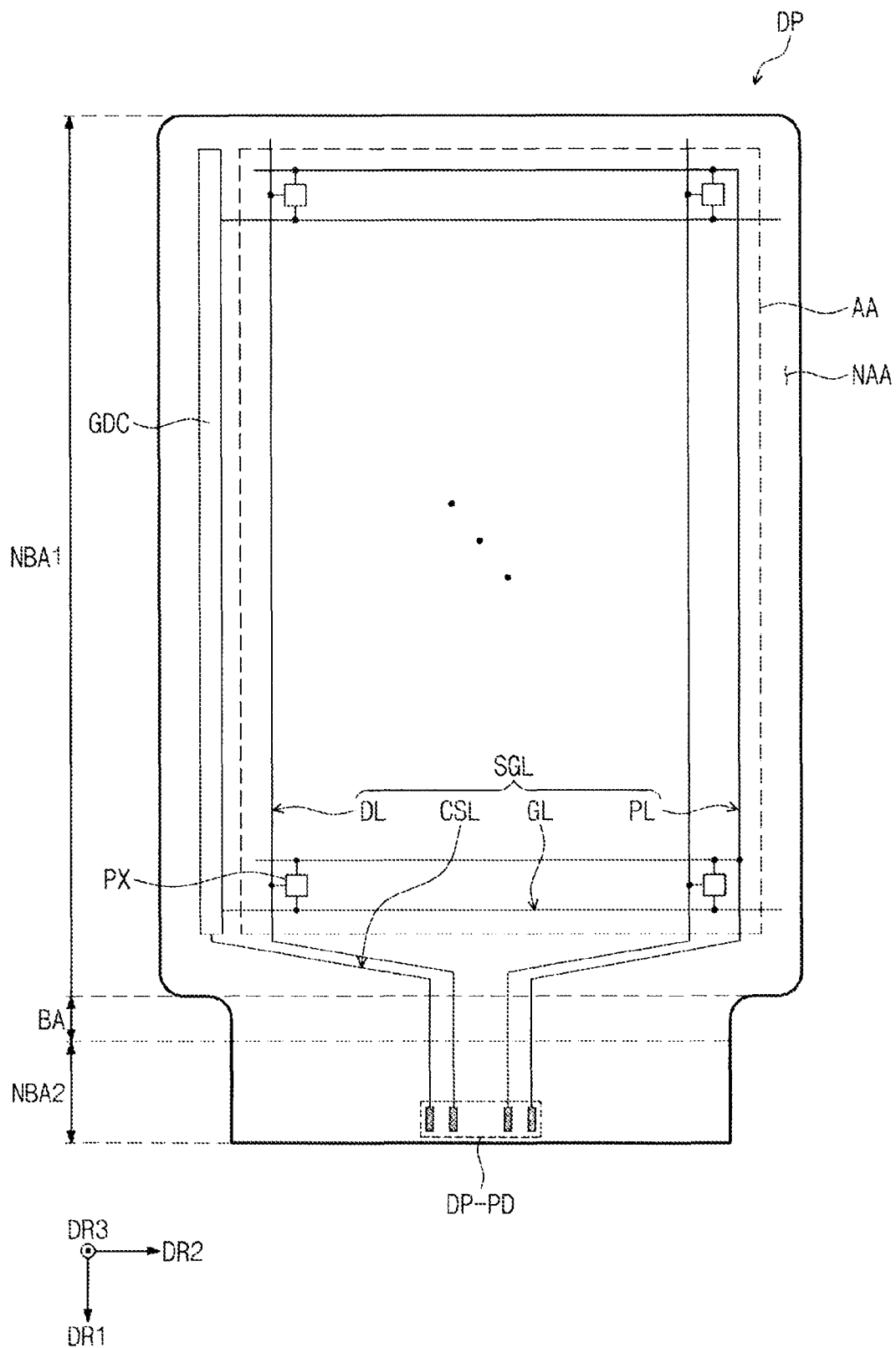
FIG. 3A is a plan view of a display panel according to an embodiment of the inventive concept.
Figure 3B:
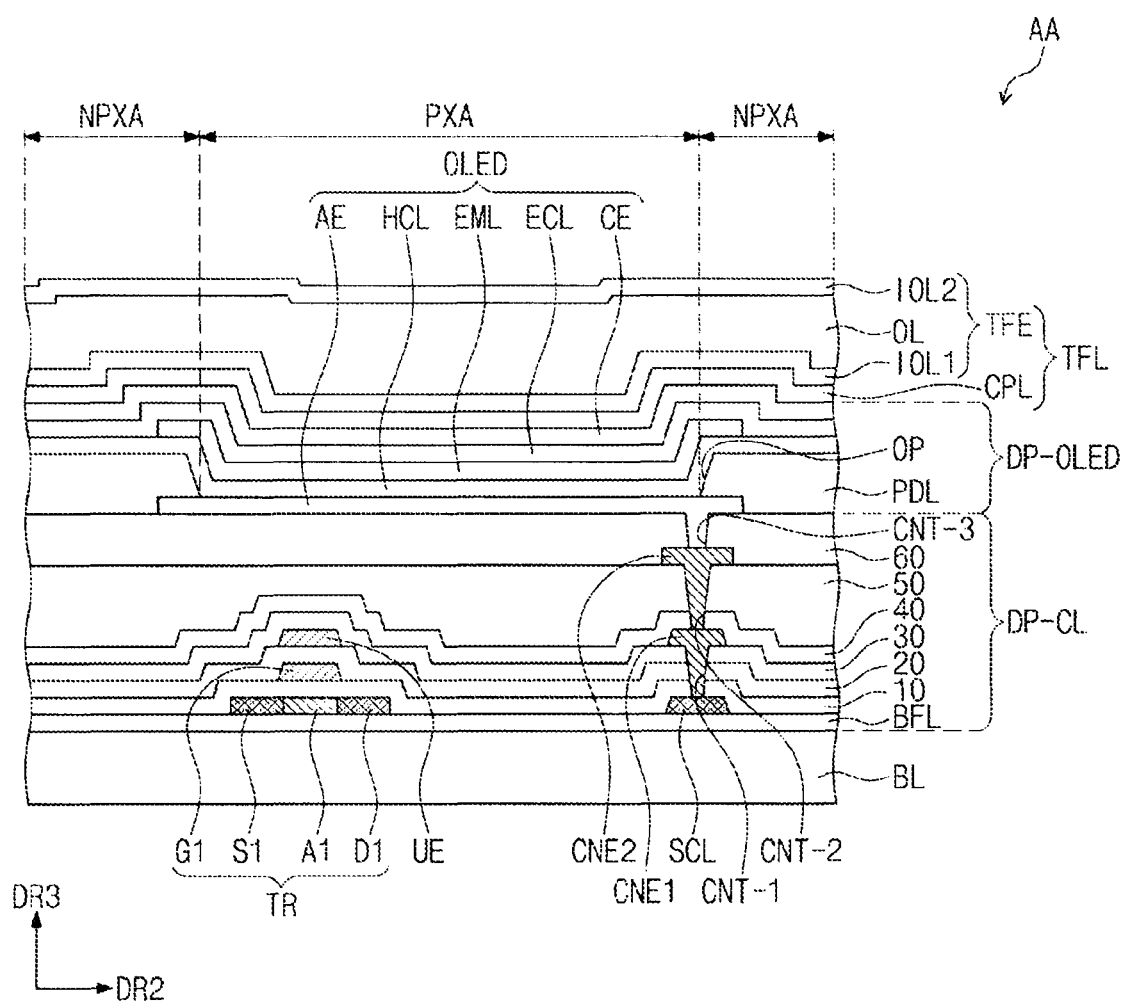
FIG. 3B is a cross-sectional view of a display panel according to an embodiment of the inventive concept.

FIG. 3A is a plan view of a display panel according to an embodiment of the inventive concept. FIG. 3B is a cross-sectional view of a display panel according to an embodiment of the inventive concept.

Referring to FIG. 3A, the display panel DP may be divided into an active region AA and a peripheral region NAA on a plane. The active region AA of the display panel DP may be a region in which an image is displayed, and the peripheral region NAA may be a region in which a driving circuit, a driving line, and the like are disposed. In the active region AA, light emission elements of each of a plurality of pixels PX may be disposed. The active region AA may overlap at least a portion of the transmissive region TA (see FIG. 1B) of the window member WM (see FIG. 1B), and the peripheral region NAA may be covered by the bezel region BZA (see FIG. 1B) of the window member WM (see FIG. 1B). The active region AA and the peripheral region NAA of display panel DP may respectively correspond to the active region AA and the peripheral region NAA of the display module DM illustrated in FIG. 1B.

According to an embodiment, the display panel DP may include the plurality of pixels PX (hereinafter, pixels), a plurality of signal lines SGL, a scan driving circuit GDC, and a display pad unit DP-PD.

Each of the pixels PX may include a light emission element and a plurality of transistors connected thereto. The pixels PC may emit light in correspondence to an electrical signal applied thereto.

The signal lines SGL include scan lines GL, data lines DL, a power line PL, and a control signal line CSL. The scan lines GL may each be connected to a corresponding pixel PX among the pixels PX. The data lines DL may each be connected to a corresponding pixel PX among the pixels PX. The power line PL may be connected to the pixels PX and provide a power voltage. The control signal line CSL may provide control signals to the scan driving circuit GDC.

The scan driving circuit GDC may be disposed in the peripheral region NAA. The scan driving circuit GDC may generate scan signals, and may sequentially output the scan signals to the scan lines GL. The scan driving circuit GDC may further output another control signal to a driving circuit of the pixels PX.

The scan driving circuit GDC may include a plurality of thin film transistors formed through the same process as that of the driving circuit of the pixels PX, for example, a low temperature polycrystalline silicon (LTPS) process, or a low temperature polycrystalline oxide (LTPO) process.

In the display panel DP of an embodiment, some regions of the display panel DP may be bent. The display panel DP may include a first non-bending region NBA1, a second non-bending region NBA2 spaced apart from the first non-bending region NBA1 in the first direction DR1, and a bending region BA defined between the first non-bending region NBA1 and the second non-bending region NBA2. The first non-bending region NBA1 may include an active region AA and a peripheral region NAA. The peripheral region NAA may include the bending region BA and the second non-bending region NBA2.

The bending region BA may be bent along a virtual axis extended in the second direction DR2. When the bending region is bent, the second non-bending region NBA2 may face the first non-bending region NBA1. According to an embodiment, the width of the display panel DP in the second direction DR2 may be smaller in the bending region BA than in the first non-bending region NBA1.

The display pad unit DP-PD may be disposed adjacent to an end of the second non-bending region NBA2. The signal lines SGL may be extended from the first non-bending region NBA1 to the second non-bending region NBA2 via the bending region NA and connected to the display pad unit DP-PD. A flexible circuit board CF (see FIG. 1B) may be electrically connected to the display pad unit DP-PD. Since the flexible circuit board CF (see FIG. 1B) is attached to the display pad unit DP-PD through an anisotropic conductive film and the like, the display panel DP and the flexible circuit board CF (see FIG. 1B) may be electrically connected to each other.

Referring to FIG. 3A and FIG. 3B, in the display panel DP of an embodiment, the circuit element layer DP-CL, the display element layer DP-OLED, and the upper insulation layer TFL may be sequentially disposed on the base layer BL. Configurations of the circuit element layer DP-CL, the display element layer DP-OLED, and the upper insulation layer TFL will be described in detail with reference to FIG. 3B.

The circuit element layer DP-CL includes at least one insulation layer and a circuit element. The circuit element includes a signal line, a driving circuit of a pixel, and the like. The circuit element layer DP-CL may be formed through a forming process of an insulation layer, a semiconductor layer, and a conductive layer by coating, deposition, and the like, and a patterning process of an insulation layer, a semiconductor layer, and a conductive layer by a photolithography process.

A buffer layer BFL may include a plurality of laminated inorganic layers. A semiconductor pattern is disposed on the buffer layer BFL. The buffer layer BFL increased a coupling force between the base layer BL and the semiconductor pattern.

The semiconductor pattern may include poly silicon. However, embodiments of the inventive concept are not limited thereto, and the semiconductor pattern may include amorphous silicon, or a metal oxide. FIG. 3B illustrates only a portion of the semiconductor pattern, and on a plane, the semiconductor pattern may be further disposed in another region of the pixel PX. The semiconductor pattern may be arranged according to a specific rule across the pixels PX.

The semiconductor pattern has different electrical properties depending on whether the semiconductor pattern is doped or not. The semiconductor pattern may include a first region A1 which is low in low doping concentration and conductivity and a second regions S1 and D1 which is relatively high in doping concentration and conductivity. One second region S1 may be disposed on one side of the first region A1, and the other one second region D1 may be disposed on the other side of the first region A1. The second regions S1 and D1 may be doped with an N-type dopant or a P-type dopant. A P-type transistor includes a doped region doped with the P-type dopant. The first region A1 may be a non-doped region, or may be doped to a lower concentration than that of the second regions S1 and D1.

The second regions S1 and D1 may substantially serve as an electrode or a signal line. The one second region S1 may correspond to a source of a transistor, and the other one second region D1 may be a drain thereof. FIG. 3B illustrates a portion of a connection signal line SCL formed from the semiconductor pattern. The connection signal line SCL may be connected to a drain of a transistor TR on a plane.

A first insulation layer 10 may be disposed on the buffer layer BFL. The first insulation layer 10 commonly overlaps the plurality of the pixels PX (see FIG. 3A), and covers the semiconductor pattern. The first insulation layer 10 may be an inorganic layer and/or an organic layer, and may have a single-layered structure or multi-layered structure. The first insulation layer may include at least one of aluminum oxide, titanium oxide, silicon oxide, silicon oxynitride, zirconium oxide, or hafnium oxide. Not only the first insulation layer 10 but also an insulation layer of the circuit element layer DP-CL to be described later may be an inorganic layer and/or an organic layer, and may have a single-layered or a multi-layered structure.

A gate G1 is disposed on the first insulation layer 10. The gate G1 may be a portion of a metal pattern. The gate G1 overlaps the first region A1. In a process of doping the semiconductor pattern, the gate G1 may function as a mask.

A second insulation layer 20 is disposed on the first insulation layer 10, and may cover the gate G1. The second insulation layer 20 commonly overlaps the pixels PX (see FIG. 3A). An upper electrode UE may be disposed on the second insulation layer 20. The upper electrode UE may overlap the gate G1. The upper electrode UE may include a multi-layered metal layer. In an embodiment of the inventive concept, the upper electrode UE may be omitted.

A third insulation layer 30 may be disposed on the second insulation layer 20, and may cover the upper electrode UE. A first connection electrode CNE1 may be disposed on the third insulation layer 30. The first connection electrode CNE1 may be connected to the connection signal line SCL through a contact hole CNT-1 passing through the first to third insulation layers 10 to 30.

A fourth insulation layer 40 may be disposed on the third insulation layer 30, and a fifth insulation layer 40 may be disposed on the fourth insulation layer 30. The fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50. A sixth insulation layer 60 may be disposed on the fifth Atmospheric 50, and may cover the second connection electrode CNE2. The sixth insulation layer 60 may be an organic layer. At least one layer among the fourth insulation layer 40 to the sixth insulation layer 60 may be omitted. For example, the fourth insulation layer 40, which is an inorganic layer, may be omitted so that the fifth insulation layer 50 may be directly disposed on the third insulation layer 30.

An organic light emission diode OLED may be disposed on the sixth insulation layer 60. A first electrode AE may be disposed on the sixth insulation layer 60. The first electrode AE is connected to the second connection electrode CNE2 through a contact hole CNT-3 passing through the sixth insulation layer 60. An opening OP is defined on a pixel definition film PDL, and the pixel definition film PDL exposes at least a portion of the first electrode AE. The pixel definition film PDL may be an organic layer.

As illustrated in FIG. 3B, a display region may include a light emission region PXA and a non-light emission region NPXA adjacent to the light emission region PXA. The non-light emission region NPXA may surround the light emission region PXA. In the present embodiment, the light emission region PXA is defined to correspond to some regions of the first electrode AE exposed by the opening OP.

A hole control layer HCL may be commonly disposed in the light emission region PXA and the non-light emission region NPXA. The hole control layer HCL may include a hole transport layer, and may further include a hole injection layer. On the hole control layer HCL, a light emission layer EML is disposed. The light emission layer EML may be disposed in a region corresponding to the opening OP. That is, the light emission layer EML may be divided and formed in each of the pixels PX (see FIG. 3A).

On the light emission layer EML, an electron control layer ECL may be disposed. The electron control layer ECL may include an electron transport layer, and may further include an electron injection layer. The hole control layer HCL and the electron control layer ECL may be commonly formed in the plurality of pixels PX using an open mask.

A second electrode CE may be disposed on the electron control layer ECL. The second electrode CE may have a shape of a single body, and may be commonly disposed in the plurality of pixels PX (see FIG. 3A).

The upper insulation layer TFL may be disposed on the display element layer DP-OLED, and may include a plurality of thin films. According to an embodiment, the upper insulation layer TFL may include a capping layer CPL and an encapsulation layer TFE disposed on the capping layer CPL. The capping layer CPL is disposed on the second electrode CE and comes in contact with the second electrode CE. The capping layer CPL may include an organic material or film.

The encapsulation layer TFE may include a first inorganic layer IOL1, an organic layer OL disposed on the first inorganic layer IOL1, and a second inorganic layer IOL2 disposed on the organic layer OL. The first inorganic layer IOL1 and the second inorganic layer IOL2 protect the display element layer DP-OLED from moisture/oxygen, and the organic layer OL protects the display element layer DP-OLED from foreign substances such as dust particles.

Figure 4:
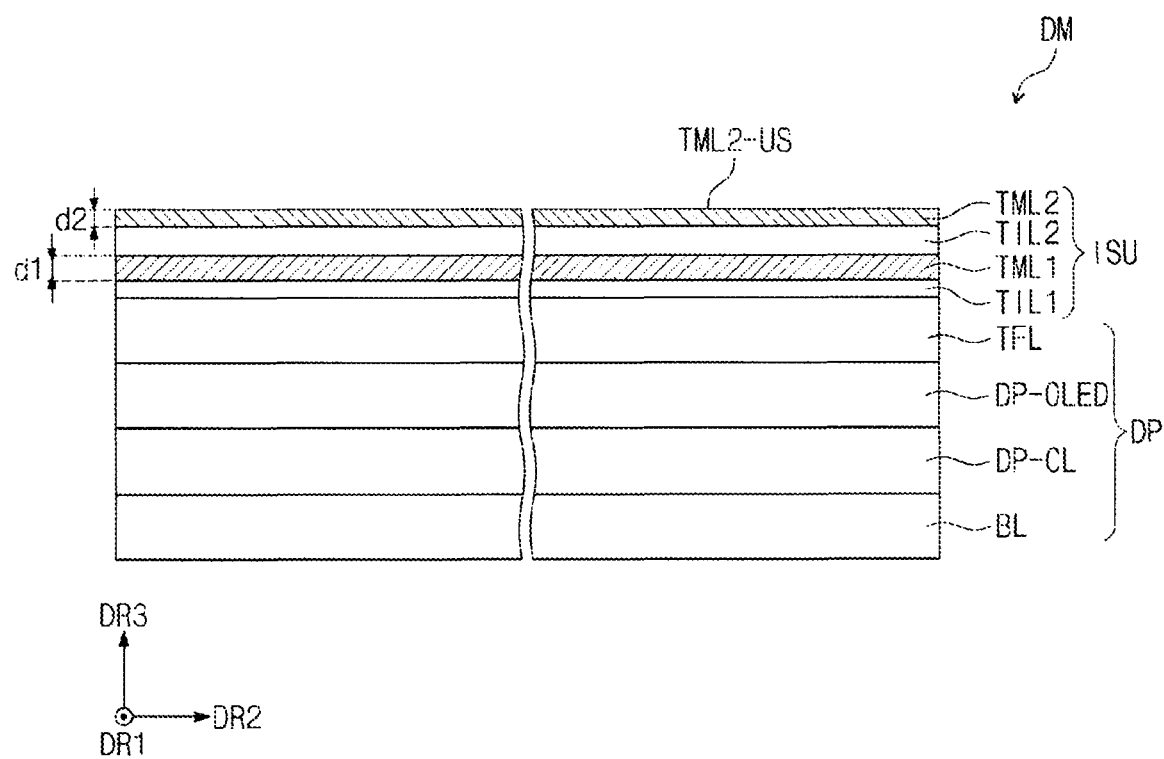
FIG. 4 is a schematic cross-sectional view of a display module according to an embodiment of the inventive concept.

FIG. 4 is a schematic cross-sectional view of a display module according to an embodiment of the inventive concept.

Referring to FIG. 4, the input sensing unit ISU may be disposed on the upper insulation layer TFL. For example, the input sensing unit may be disposed on the second inorganic layer IOL2 of FIG. 3B. In an embodiment, the input sensing unit ISU includes a first sensing insulation layer TIL1 a first sensing conductive layer TML1, a second sensing insulation layer TIL2, and a second sensing conductive layer TML2.

The first sensing insulation layer TIL1 may be directly disposed on the upper insulation layer TFL. According to an embodiment of the input sensing unit ISU, the first sensing insulation layer TIL1 is omitted. When the first sensing insulation layer TIL1 is omitted, the first sensing conductive layer TML1 may contact the upper insulation layer TFL.

Each of the first sensing conductive layer TML1 and the second sensing conductive layer TML2 may have a single-layered structure, or a multi-layered structure. A conductive layer of a multi-layered structure may include at least two of a transparent conductive layer and a metal layer. The conductive layer of a multi-layered structure may include metal layers including different metals from each other.

The first sensing conductive layer TML1 and the second sensing conductive layer TML2 may include, as a transparent conductive layer, at least one of indium tin oxide (ITO), indium zinc oxide (IZO), zinc oxide (ZnO), indium tin zinc oxide (ITZO), PEDOT, a metal nanowire, or graphene. The first sensing conductive layer TML1 and the second sensing conductive layer TML2 may include, as a metal layer, molybdenum, silver, titanium, copper, aluminum, or an alloy thereof. In an embodiment, the first sensing conductive layer TML1 and the second sensing conductive layer TML2 do not include an insulating or dielectric material.

For example, each of the first sensing conductive layer TML1 and the second sensing conductive layer TML2 may have a three-layered structure composed of titanium/aluminum/titanium. A metal having relatively high durability and low reflectance may be applied to an outer layer of a conductive layer, and a metal having high electrical conductivity may be applied to an inner layer of the conductive layer.

In the input sensing unit ISU of an embodiment, the second sensing conductive layer TML2 does not have any other layers disposed thereon. That is, an upper surface TML2-US of the second sensing conductive layer TML2 may define the uppermost surface of the input sensing unit ISU. For example, the upper surface TML2-US may be exposed to the air. The second sensing conductive layer TML2 does not have any other insulation layers disposed thereon. For example, an insulation layer is not disposed on the upper surface TML2-US of the second sensing conductive layer TML2.

In the input sensing unit ISU of an embodiment, the first sensing conductive layer TML1 has a first thickness d1, and the second sensing conductive layer TML2 has a second thickness d2. In an embodiment, the first thickness d1 is greater than the second thickness d2. In an embodiment, the first thickness d1 ranges from approximately (or precisely) 1.5 times to approximately (or precisely) 4.0 times the second thickness d2. In an embodiment, the first thickness d1 ranges from approximately 2000 Å to approximately 4000 Å, and the second thickness d2 ranges from approximately 700 Å to approximately 1500 Å. In an embodiment, the first thickness d1 ranges from precisely 2000 Å to precisely 4000 Å, and the second thickness d2 ranges from precisely 700 Å to precisely 1500 Å. In the input sensing unit ISU of an embodiment, the first sensing conductive layer TML1 disposed in a lower portion may be designed to be thick, and the second sensing conductive layer TML2 disposed in the uppermost portion of the input sensing unit ISU may be designed to be thinner than the first sensing conductive layer TML1. In an embodiment, the thicknesses of the first sensing conductive layer TML1 and the second sensing conductive layer TML2 are uniform.

In an embodiment, the first sensing insulation layer TIL1 includes an inorganic film, and the second sensing insulation layer TIL2 includes an organic film. In an embodiment, the second sensing insulation layer TIL2 is entirely made up of the organic film and includes no inorganic layer. In an embodiment, the first sensing insulation layer TIL1 is entirely made up of the inorganic film and includes no organic layer. The inorganic film may include at least one of aluminum oxide, titanium oxide, silicon oxide, silicon nitride, silicon oxynitride, zirconium oxide, or hafnium oxide. The organic film may include at least one of an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, or a perylene-based resin. Alternatively, the organic film may include polyester.

Figure 5:
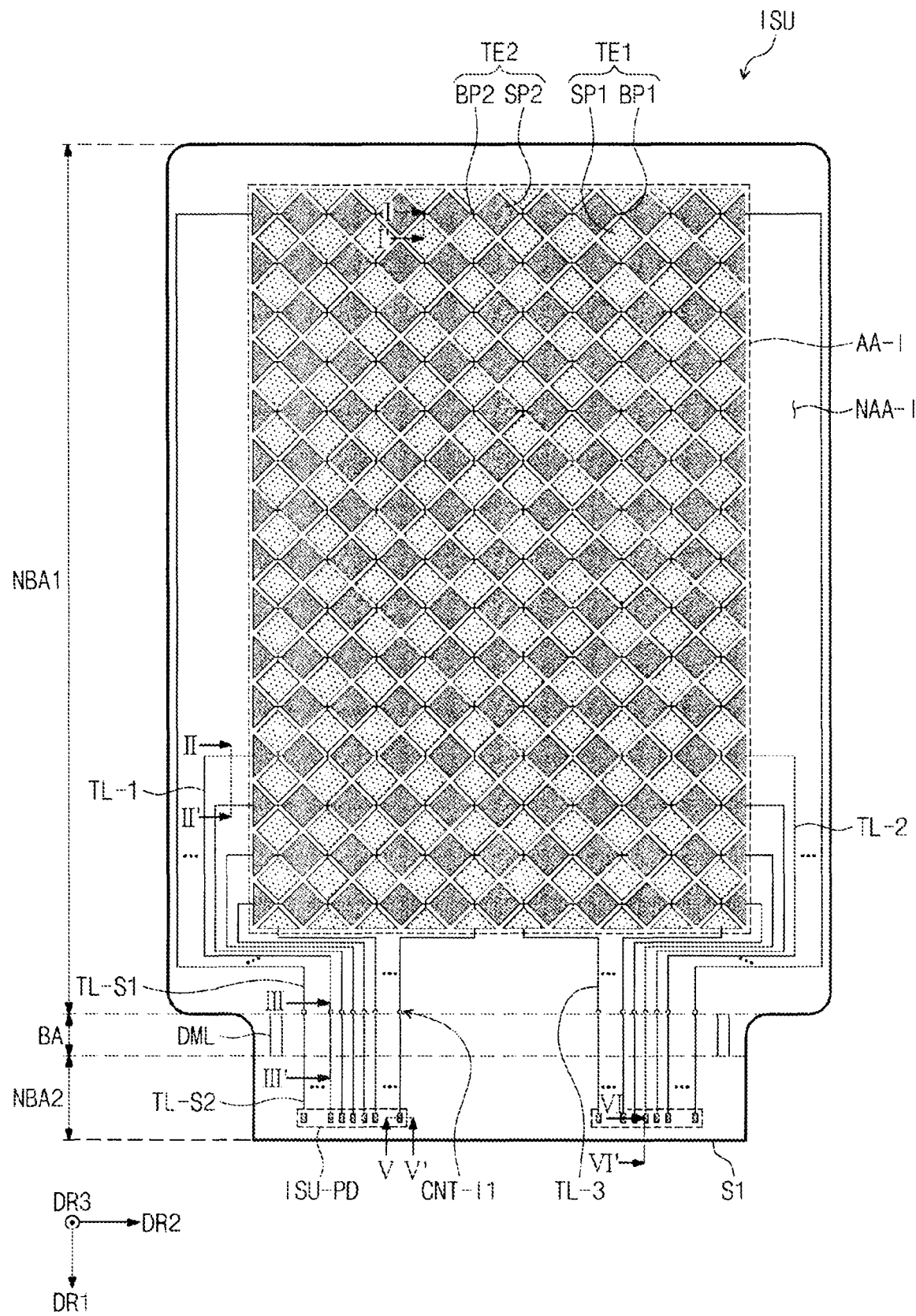
FIG. 5 is a plan view of an input sensing unit (e.g., an input sensor or input sensing device) according to an embodiment of the inventive concept.
Figure 6A:
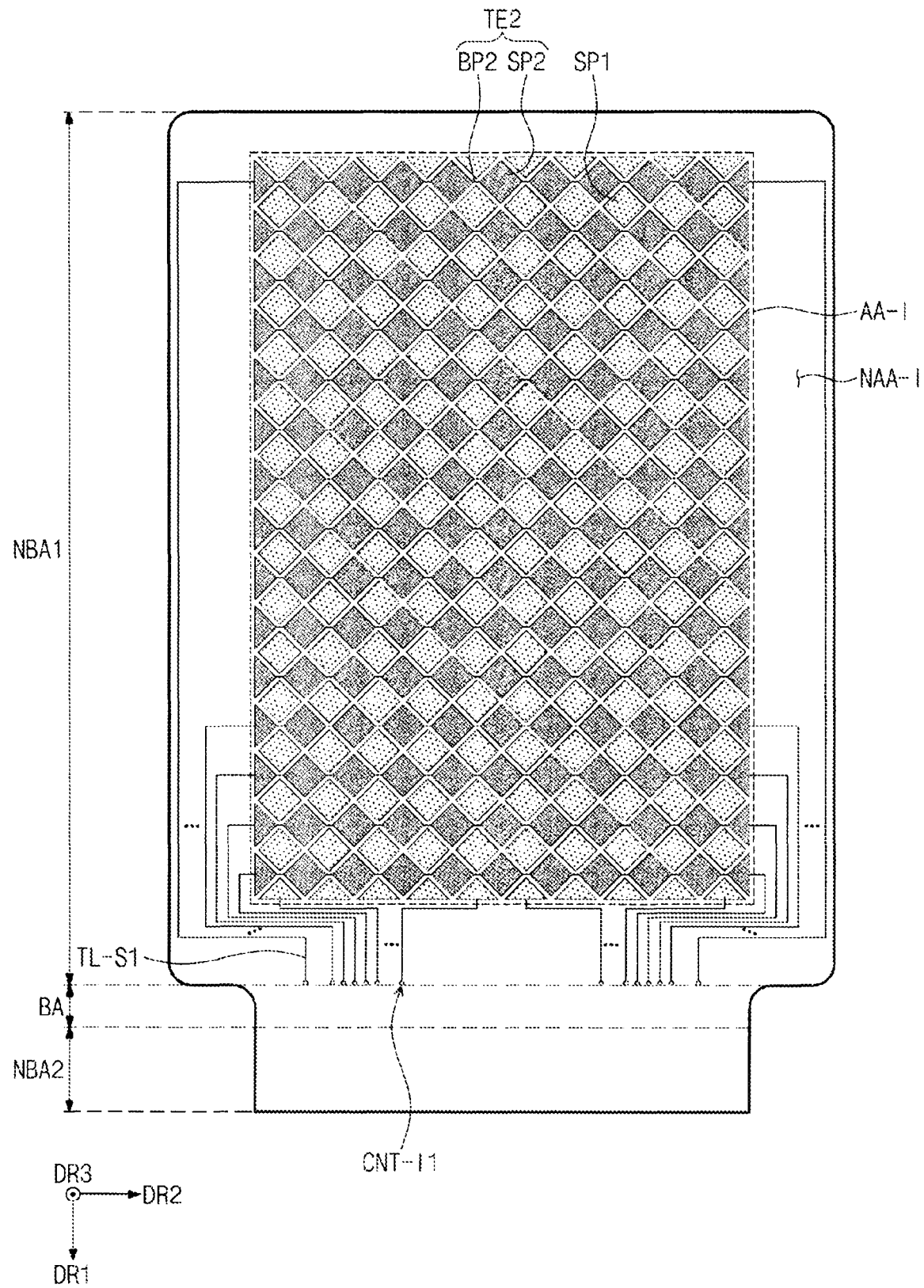
FIG. 6A and FIG. 6B are each a plan view showing some components of an input sensing unit according to an embodiment of the inventive concept.
Figure 6B:
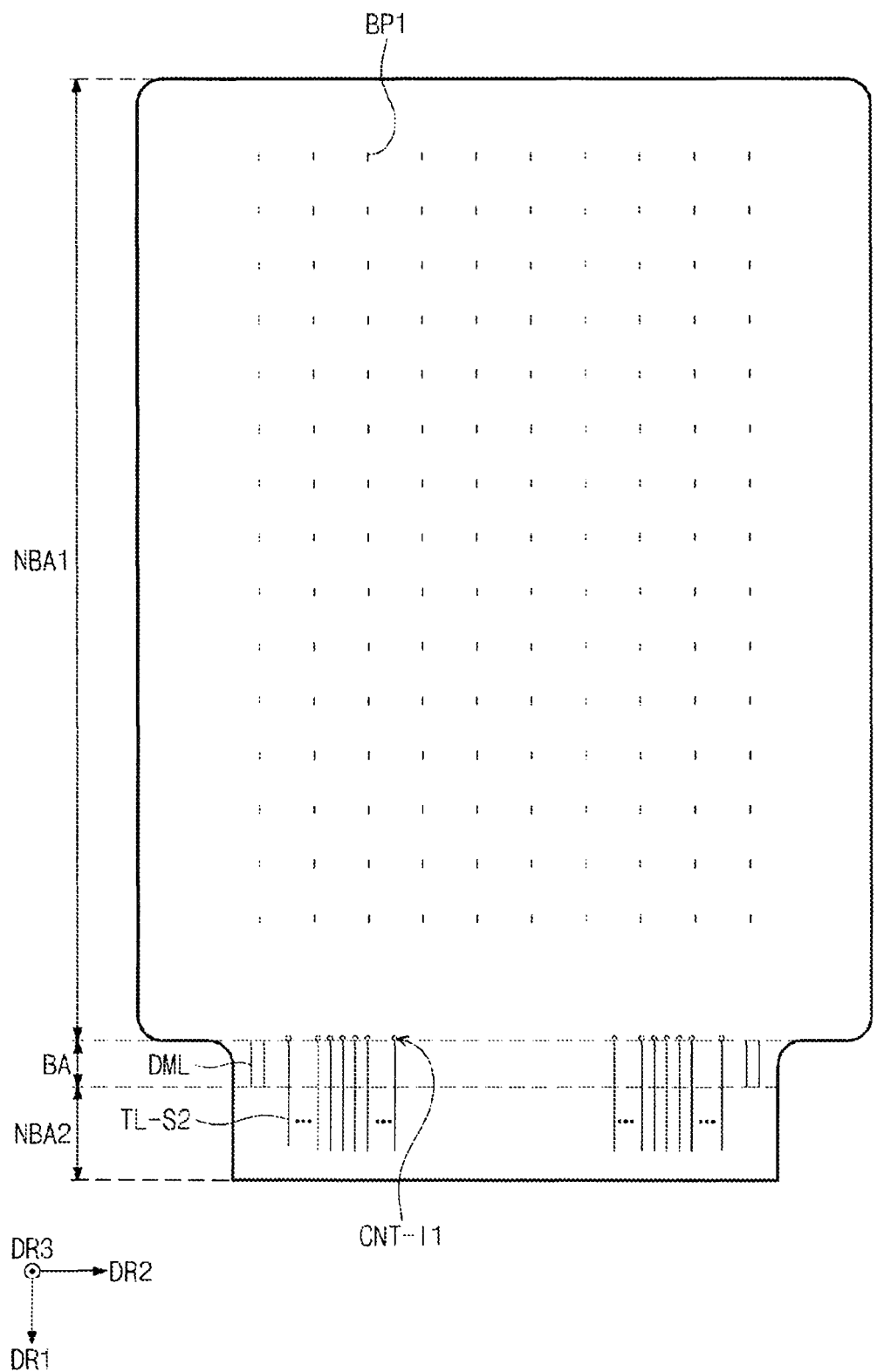
Figure 7A:
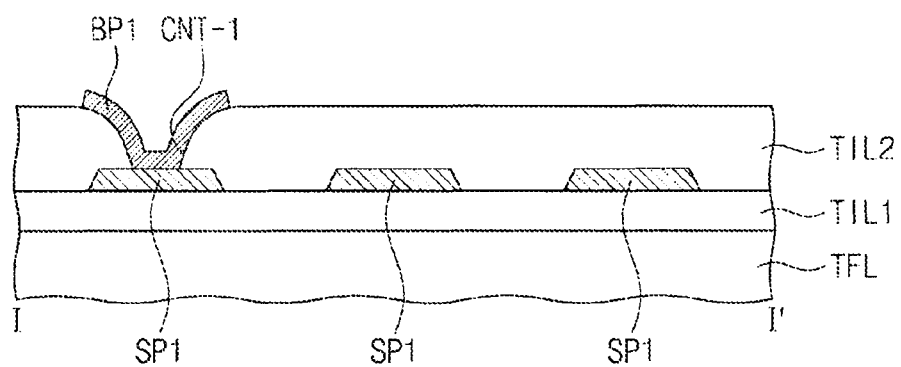
FIG. 7A and FIG. 7B are each a cross-sectional view of a portion of an input sensing unit according to an embodiment of the inventive concept.
Figure 7B:
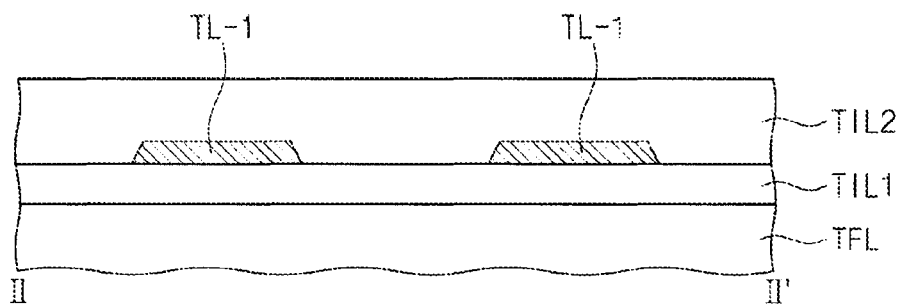
Figure 8A:
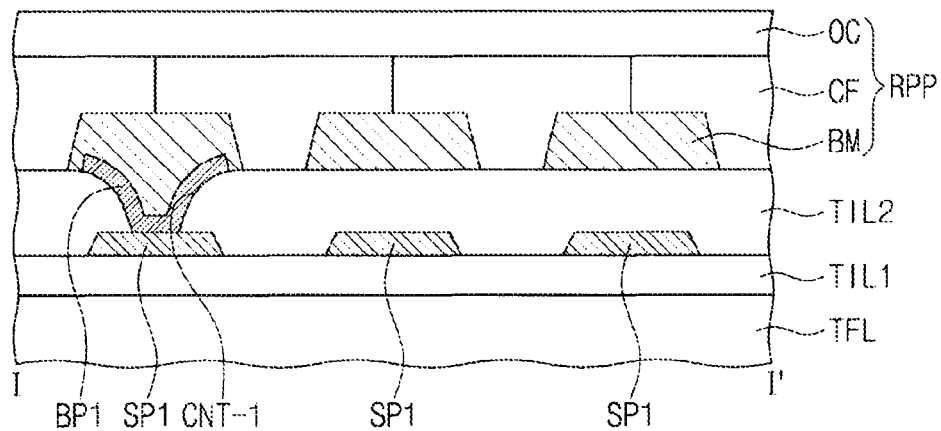
FIG. 8A and FIG. 8B are cross-sectional views of a portion of an input sensing unit and an anti-reflection member according to an embodiment of the inventive concept.
Figure 8B:
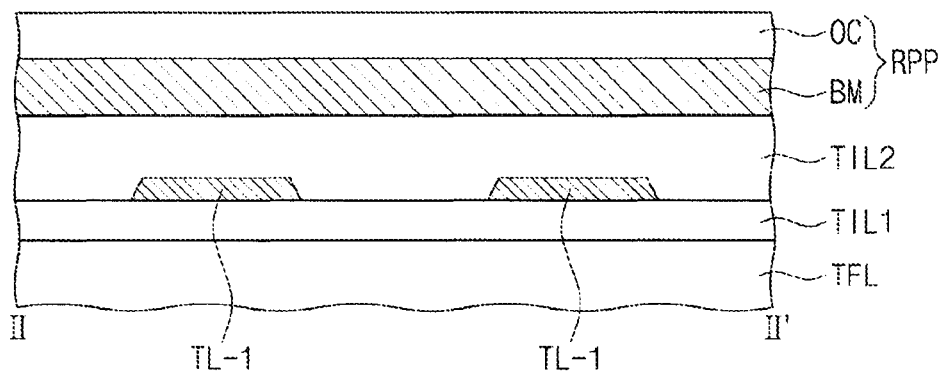
Figure 9:
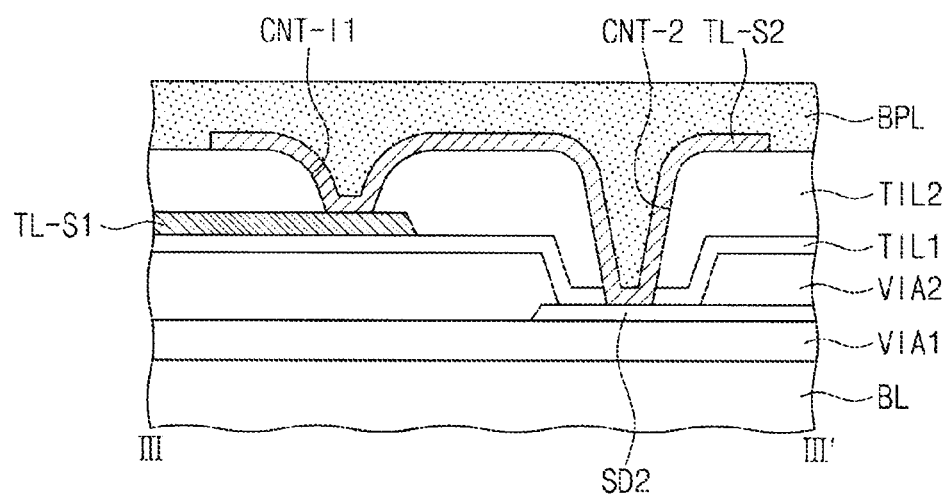
FIG. 9 is a cross-sectional view of a portion of an input sensing unit according to an embodiment of the inventive concept.
Figure 10A:
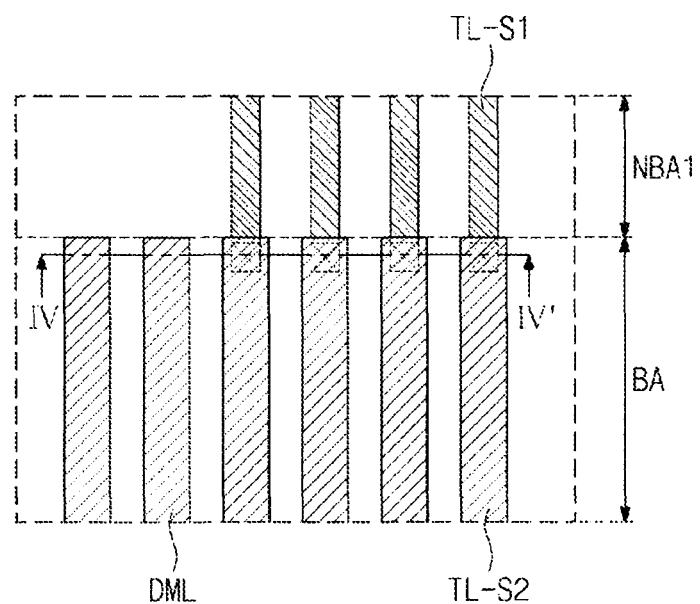
FIG. 10A is a plan view of an enlarged portion of an input sensing unit according to an embodiment of the inventive concept.
Figure 10B:
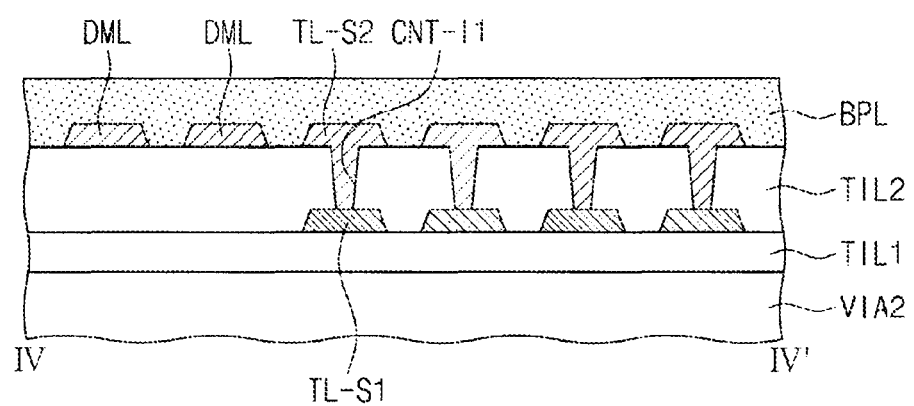
FIG. 10B is a cross-sectional view of a portion of an input sensing unit according to an embodiment of the inventive concept.
Figure 11:
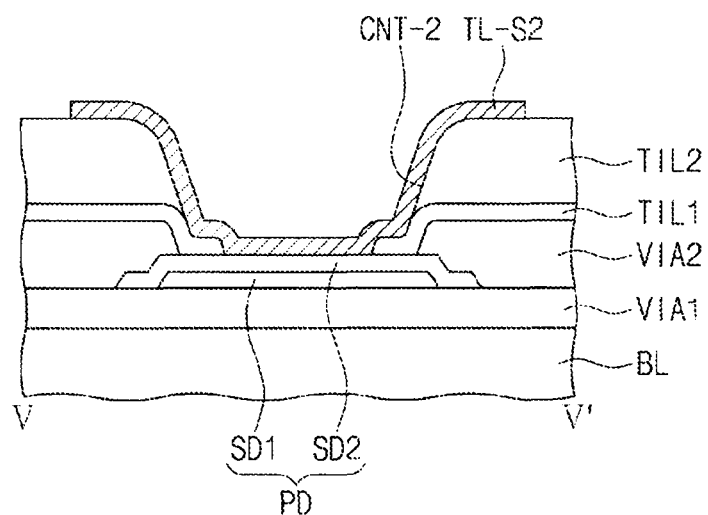
FIG. 11 and FIG. 12 are each a cross-sectional view of a portion of an input sensing unit according to an embodiment of the inventive concept.
Figure 12:
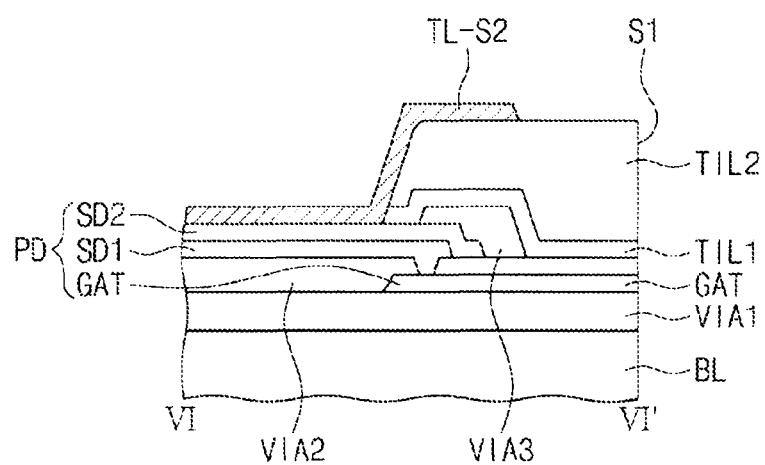

FIG. 5 is a plan view of an input sensing unit according to an embodiment of the inventive concept. FIG. 6A and FIG. 6B are each a plan view showing some components of an input sensing unit according to an embodiment of the inventive concept. FIG. 7A, FIG. 7B, and FIG. 9 are cross-sectional views of a portion of an input sensing unit according to an embodiment of the inventive concept. FIG. 8A and FIG. 8B are cross-sectional views of a portion of an input sensing unit and an anti-reflection member according to an embodiment of the inventive concept; FIG. 10A is a plan view of an enlarged portion of an input sensing unit according to an embodiment of the inventive concept. FIG. 10B is a cross-sectional view of a portion of an input sensing unit according to an embodiment of the inventive concept. FIG. 11 and FIG. 12 are each a cross-sectional view of a portion of an input sensing unit according to an embodiment of the inventive concept. FIG. 7A illustrates a cross-section taken along line I-I' illustrated in FIG. 5. FIG. 7B illustrates a cross-section taken along line II-II' illustrated in FIG. 5. FIG. 9 illustrates a cross-section taken along line III-III' illustrated in FIG. 5. FIG. 10A illustrates some of sensing lines and dummy lines in a portion adjacent to the bending region BA in an input sensing unit. FIG. 10B illustrates a cross-section taken along line IV-IV' illustrated in FIG. 10A. FIG. 11 illustrates a cross-section taken along line V-V' illustrated in FIG. 5. FIG. 12 illustrates a cross-section taken along line VI-VI' illustrated in FIG. 5.

Referring to FIG. 5, the input sensing unit ISU may be divided into an active region AA-I and a peripheral region NAA-I adjacent to the active region AA-I. The active region AA-I and the peripheral region NAA-I of the input sensing unit ISU may respectively correspond to the active region AA (see FIG. 3A) and the peripheral region NAA (see FIG. 3A) of the display panel DP (see FIG. 3A). For example, the active region AA-I may overlap the active region AA, and the peripheral region NAA-I may overlap the peripheral region NAA.

According to an embodiment, the input sensing unit ISU may include a first non-bending region NBA1, a bending region BA, and a second non-bending region NBA2. Each of the first non-bending region NBA1, the bending region BA, and the second non-bending region NBA2 of the input sensing unit ISU may respectively correspond to the first non-bending region, the bending region, and the second non-bending region of the display panel DP.

According to an embodiment, the input sensing unit ISU may include an input pad unit ISU-PD including a plurality of sensing electrodes TE1 and TE2, a plurality of sensing lines TL-1, TL-2, and TL-3, each of which is connected to the sensing electrodes TE1 and TE2, and a plurality of sensing pads. One end of the plurality of sensing lines TL-1, TL-2, and TL-3 may be connected to a plurality of sensing electrodes TE1 and TE2, and the other end thereof may be connected to the plurality of sensing pads disposed in the input pad unit ISU-PD.

The plurality of sensing electrodes TE1 and TE2 may include a first sensing electrode TE1 and a second sensing electrode TE2.

The first sensing electrode TE1 may extend in the first direction DR1, and may be provided in a plurality of rows and arranged along the second direction DR2. The first sensing electrode TE1 may include first sensing patterns SP1 and first conductive patterns BP1. The first sensing patterns SP1 may be arranged along the first direction DR1. At least one first conductive pattern BP1 may be connected to two first sensing patterns SP1 adjacent to each other. At least one first conductive agent pattern BP1 may be disposed between two first sensing patterns SP1 adjacent to each other.

The second sensing electrode TE2 may extend in the second direction DR2, and may be provided in a plurality of columns and arranged along the first direction DR1. The second sensing electrode TE2 may include second sensing patterns SP2 and second conductive patterns BP2. The second sensing patterns SP2 may be arranged along the second direction DR2. According to an embodiment, the second sensing patterns SP2 and second conductive patterns BP2 may be patterns having a single body shape patterned by the same process.

The first sensing electrode TE1 and the second sensing electrode TE2 may each include a plurality of conductive lines crossing each other, and may have a mesh shape in which a plurality of openings are defined.

FIG. 6A shows, among components included in an input sensing unit, the components included in the first sensing conductive layer TML1 described with reference to FIG. 4 on a plane, and FIG. 6B shows, among the components included in an input sensing unit, the components included in the second sensing conductive layer TML2 described with reference to FIG. 4 on a plane. That is, the first sensing patterns SP1, the second sensing patterns SP2, and the second conductive pattern BP2 illustrated in FIG. 6A may be included in the first sensing conductive layer TML1 described with reference to FIG. 4, and the first conductive pattern BP1 illustrated in FIG. 6B may be included in the second sensing conductive layer TML2 described with reference to FIG. 4.

The plurality of sensing lines TL-1, TL-2, and T3 may include first sensing lines TL-1, second sensing lines TL-2, and third sensing lines TL-3. According to an embodiment, the first sensing lines TL-1 may each be connected to one end of each of the second sensing electrodes TE2, and the second sensing lines TL-2 may each be connected to the other end of each of the second sensing electrodes TE2. The third sensing lines TL-3 may be connected to one end of each of the first sensing electrodes TE1 adjacent to the bending region BA. However, embodiments of the inventive concept are not limited thereto, and a sensing line may be connected to any one of one end or the other end of the second sensing electrode TE2. In addition, a sensing line may additionally be connected to the other end, which opposes the one end of each of the first sensing electrodes TE1 to which each of the third sensing lines TL-3 is connected.

Each of the plurality of sensing lines TL-1, TL-2, and TL-3 may include a first portion TL-S1 and a second portion TL-S2. The first portion TL-S1 may be a portion connected to the first sensing electrodes TE1 and the second sensing electrodes TE2, and may be a portion overlapping the first non-bending region NBA1. The second portion TL-S2 may be a portion overlapping the bending region BA, and may be connected to the first portion TL-S1 by an input contact hole CNT-I1. The second portion TL-S2 may be a portion overlapping the second non-bending region NBA2, and may be connected to a sensing pad disposed in the input pad unit ISU-PD.

In an embodiment, the input sensing unit ISU further includes a dummy line DML disposed adjacent to some of the plurality of sensing lines TL-1, TL-2, and TL-3. The dummy line DML may overlap the bending region BA, and may be disposed adjacent to the second portion TL-S2 disposed in the bending region BA. In the bending region BA, the dummy line DML may be disposed at an outer peripheral portion of the bending region BA than the second portion TL-S2 is. In the bending region BA, the second portion TL-S2 may be disposed in a more central portion of the bending region BA than the dummy line DML is. In an embodiment, the second portion TL-S2 and the dummy line DML are disposed spaced apart along the second direction DR2.

As described above, the configurations illustrated in FIG. 6A may be included in the first sensing conductive layer TML1 described with reference to FIG. 4. That is, as illustrated in FIG. 6A, the first portion TL-S1 may be included in the first sensing conductive layer TML1 described with reference to FIG. 4. In addition, as described above, the configurations illustrated in FIG. 6B may be included in the second sensing conductive layer TML2 described with reference to FIG. 4. That is, as illustrated in FIG. 6B, the second portion TL-S2 may be included in the second sensing conductive layer TML2 described with reference to FIG. 4. In addition, the dummy line DML may be included in the second sensing conductive layer TML2 described with reference to FIG. 4.

As illustrated in FIG. 5 and FIG. 7A, the first sensing patterns SP1 included in the first sensing electrode TE1 may be disposed on the first sensing insulation layer TIL1. That is, the first sensing patterns SP1 may be included in the first sensing conductive layer TML1 described with reference to FIG. 4. The conductive pattern BP1 included in the first sensing electrode TE1 may be disposed on the second sensing insulation layer TIL2. That is, the first conductive pattern BP1 may be included in the second sensing conductive layer TML2 described with reference to FIG. 4. The first conductive pattern BP1 may be electrically connected to the first sensing pattern SP1 through an electrode contact hole CNT-1 defined on the second sensing insulation layer TIL2. The electrode contact hole CNT-1 may expose at least a portion of the first sensing pattern SP1. Except for the portion exposed by the electrode contact hole CNT-1, the first sensing pattern SP1 may be covered by the second sensing insulation layer TIL2. In the present disclosure, the first conductive pattern BP1 may be referred to as a "connection pattern."

In an embodiment, a taper angle of the electrode contact hole CNT-1 defined on the second sensing insulation layer TIL2 ranges from approximately 60 degrees to approximately 75 degrees. In an embodiment, the taper angle of the electrode contact hole CNT-1 ranges from approximately 61 degrees to approximately 72 degrees. In an embodiment, the taper angle of the electrode contact hole CNT-1 is approximately 66.1 degrees. In an embodiment, a taper angle of the electrode contact hole CNT-1 defined on the second sensing insulation layer TIL2 ranges from precisely 60 degrees to precisely 75 degrees. In an embodiment, the taper angle of the electrode contact hole CNT-1 ranges from precisely 61 degrees to precisely 72 degrees. In an embodiment, the taper angle of the electrode contact hole CNT-1 is precisely 66.1 degrees.

As described with reference to FIG. 4, in the input sensing unit ISU of an embodiment, the second sensing conductive layer TML2 may be disposed on the uppermost layer of the input sensing unit ISU. That is, as described in FIG. 7A, the first conductive pattern BP1 may be disposed on the second sensing insulation layer TIL2, and may be disposed on the uppermost layer of the input sensing unit ISU. In an embodiment, the first conductive pattern BP1 does not have any other layers such as an insulation layer disposed thereon.

In an embodiment, the length of the first conductive pattern BP1 on a plane is approximately or precisely 5 mm or less. For example, the length of the first conductive pattern BP1 on a plane may be approximately or precisely 4 mm. In the input sensing unit ISU of an embodiment, the length of the first conductive pattern BP1 on a plane is designed to be approximately or precisely 5 mm, so that even when a separate insulation layer is not disposed on the first conductive pattern BP1, short circuits of the first conductive pattern BP1 may not occur.

As illustrated in FIG. 5 and FIG. 7B, among the plurality of sensing lines, the first portion TL-S1 may be disposed on the first sensing insulation layer TIL1. That is, the first portion TL-S1 may be included in the first sensing conductive layer TML1 described with reference to FIG. 4. On the first portion TL-S1, the second sensing insulation layer TIL2 including an organic film may be disposed. The first portion TL-S1 may be covered by the second sensing insulation layer TIL2.

As described with reference to FIG. 4, in the input sensing unit ISU of an embodiment, the second sensing conductive layer TML2 is disposed on the uppermost layer of the input sensing unit ISU. That is, as described in FIG. 7A, the first conductive pattern BP1 may be disposed on the second sensing insulation layer TIL2, and may be disposed on the uppermost layer of the input sensing unit ISU. In an embodiment, the first conductive pattern BP1 does not have any other layers such as an insulation layer disposed thereon. For example, other layers may not be disposed on an upper surface of the first conductive pattern BP1.

In an input sensing unit included in a display device of an embodiment, the second sensing conductive layer TML2 is disposed on the uppermost layer of the input sensing unit, and the second sensing conductive layer does not have a separate insulation layer disposed thereon. That is, the input sensing unit may have a structure in which additional layers are omitted, compared to a typical input sensing unit in which a separate organic insulation layer is disposed. Accordingly, the input sensing unit included in the display device of an embodiment may have simplified process steps and reduced costs since a mask process for forming an organic insulation layer on the second sensing conductive layer TML2 may be omitted.

Since an organic insulation layer is omitted from being disposed on the second sensing conductive layer TML2, an upper surface of the second sensing conductive layer TML2 may be exposed, thereby allowing short circuits to occur. However, in the input sensing unit of an embodiment, the first sensing patterns SP1, the second sensing patterns SP2, the second conductive patterns BP2, and the like, except for the first conductive pattern BP1, are formed as the first sensing conductive layer TML1 which is covered by the second sensing insulation layer TIL2, and the first portion TL-S1 among the plurality of sensing lines TL-1, TL-2, and TL-3 is also formed as the first sensing conductive layer TML1, so that the occurrence of short circuits may be reduced to a minimum. In the input sensing unit of an embodiment, the second sensing insulation layer TIL2 which covers the first sensing conductive layer TML1 includes an organic film, so that among the first sensing patterns SP1, the second sensing patterns SP2, the second conductive pattern BP2, and the plurality of sensing lines TL-1, TL-2, and TL-3, all of which are formed as the first sensing conductive layer TML1, the first portion TL-S1 may be prevented from being short-circuited. Further, the second sensing conductive layer TML2 may be thinner than the first sensing conductive layer TML1, and the first conductive pattern BP1 which is formed through the second sensing conductive layer TML2 may be also designed to have a minimized length of approximately or precisely 5 mm or less on a plane, so that the occurrence of short circuits may be reduced to a minimum. Accordingly, the input sensing unit of an embodiment may have simplified process steps and reduced costs as well as minimized occurrence of defects such as short circuits, so that a display device including the input sensing unit may have increased reliability.

Referring to FIG. 5, FIG. 8A, and FIG. 8B together, an anti-reflection member RPP may be directly disposed on the input sensing unit. In an embodiment, the anti-reflection member RPP may include a plurality of color filters CF and a light-blocking pattern BM disposed between the color filters CF. The anti-reflection member RPP may further include an overcoat layer OC which covers the color filter CF and the light-blocking pattern BM.

As illustrated in FIG. 5, FIG. 7A, and FIG. 8A, at least a portion of the light-blocking pattern BM included in the anti-reflection member RPP may be disposed on the first conductive pattern BP1. At least a portion of the light blocking pattern BM may cover an exposed upper surface of the first conductive pattern BP1. For example, a portion of the light blocking pattern BM may contact and cover an entire exposed upper surface of the first conductive pattern BP1.

The light blocking pattern BM may have an opening defined therein. A portion of the color filter CF may be disposed in the opening defined in the light blocking pattern BM. A portion of the color filter CF may be disposed on the light blocking pattern BM. The color filter CF may transmit light generated from a light emission element, and may block some wavelength bands of external light.

The light blocking pattern BM and the color filter CF may each include an organic material or film. The light blocking pattern BM may include a black material such as carbon black. The color filter CF may include an organic material with a color such as red, blue, and green. The light-blocking pattern BM included in the anti-reflection member RPP may further include an organic material or film to prevent corrosion of the first conductive pattern BP1 in contact.

The overcoat layer OC may cover the light blocking pattern BM and the color filter CF. The overcoat layer OC may include an organic material or film, and may provide a flat upper surface. The overcoat layer OC may be omitted.

As illustrated in FIG. 5, FIG. 7A, and FIG. 8B, in an embodiment, the anti-reflection member RPP does not include a color filter in a portion overlapping the peripheral region NAA-I. The light blocking pattern BM may be directly disposed on the second sensing insulation layer TIL2.

FIG. 8A and FIG. 8B exemplarily illustrate that an anti-reflection member includes a color filter and a light-blocking pattern, but embodiments of the inventive concept is not limited thereto. An anti-reflection member may include a polarizing structure such as a polarizing plate. In this case, the polarizing plate included in the anti-reflection member may be attached on an input sensing unit through an adhesive layer. The adhesive layer which adheres the polarizing plate may be directly disposed on the second sensing insulation layer TIL2. The adhesive layer which adheres the polarizing plate may be directly disposed on the second sensing insulation layer TIL2. The adhesive layer may be disposed on the first conductive pattern BP1, and may cover an exposed upper surface of the first conductive pattern BP1.

FIG. 8A and FIG. 8B exemplarily illustrate that an anti-reflection member includes a color filter and a light blocking pattern, but embodiments of the inventive concept are not limited thereto. An anti-reflection member may include a reflection adjustment layer disposed on the light blocking pattern instead of the color filter. The reflection adjustment layer may selectively absorb light reflected from the inside of a display panel and/or an electronic device, or light of some bandwidths among light incident from the outside of the display panel and/or the electronic device. A portion of the reflection adjustment layer may be disposed in the opening of the light blocking pattern BM described above.

As an example, the reflection adjustment layer may absorb light of a first wavelength region ranging from approximately (or precisely) 490 nm to approximately (or precisely) 505 nm and light of a second wavelength region ranging from approximately (or precisely) 585 nm to 600 nm, and thus, may be provided to have a light transmittance of approximately 40% or less in the first wavelength region and the second wavelength region. The reflection adjustment layer may absorb light of a wavelength which is outside wavelength ranges of red, green, and blue light respectively emitted from a first display element, a second display element, and a third display element. As described above, since the reflection adjustment layer absorbs light of a wavelength which does not belong to a wavelength range of red, green, or blue light emitted from the display elements, a decrease in luminance of the display panel and/or the electronic device may be prevented or minimized. In addition, at the same time, degradation in luminescence efficiency of the display panel and/or the electronic device may be prevented or minimized, and visibility may be increased.

The reflection adjustment layer may be provided as an organic layer including a dye, a pigment, or a combination thereof. The reflection adjustment layer may include a tetra aza porphyrin (TAP)-based compound, a porphyrin-based compound, a metal porphyrin-based compound, an oxazine-based compound, a squarylium-based compound, triaryl-methane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and a combination thereof.

In an embodiment, the reflection adjustment layer may have a transmittance ranging from approximately (or precisely) 64% to approximately (or precisely) 72%. The transmittance of the reflection adjustment layer may be adjusted according to the content of a pigment and/or a dye included in the reflection adjustment layer. When the anti-reflection member includes a reflection adjustment layer, a low-reflective inorganic layer may be further disposed on the above-described capping layer.

The low-reflective inorganic layer may include an inorganic material having a low reflectance, and may include a metal or a metal oxide as an embodiment. When the low-reflective inorganic layer includes a metal, the low-reflective inorganic layer may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In addition, when the low-reflective inorganic layer includes a metal oxide, the low-reflective inorganic layer may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

Referring to FIG. 5 and FIG. 9, each of the plurality of sensing lines TL-1, TL-2, and TL-3 includes the first portion TL-S1 and the second portion TL-S2, and the first portion TL-S1 and the second portion TL-S2 may be electrically connected to each other through the input contact hole CNT-I1 formed at the boundary of the bending region BA. The input contact hole CNT-I1 may be formed through the second sensing insulation layer TIL2. The first portion TL-S1 may be disposed on the first sensing insulation layer TILL and the second portion TL-S2 may be disposed on the second sensing insulation layer TIL2. That is, the first portion TL-S1 may be included in the first sensing conductive layer TML1 described above with reference to FIG. 4, and the second portion TL-S2 may be included in the second sensing conductive layer TML2 described above with reference to FIG. 4.

The second portion TL-S2 may be connected to a sensing pad PD through a pad contact hole CNT-2 defined in the first sensing insulation layer TIL1 and the second sensing insulation layer TIL2. The sensing pad PD may be disposed in the above-described input pad unit ISU-PD. The sensing pad PD may be disposed on the base layer BL, and may be disposed on at least some of insulation layers VIA1 and VIA2, and may be covered by at least some of the insulation layers VIA1 and VIA2. Each of the insulation layers VIA1 and VIA2 may correspond to at least one of a plurality of insulation layers included in the circuit element layer DP-CL described with reference to FIG. 3B.

As described with reference to FIG. 2B, a display device of an embodiment may include the bending protective layer BPL disposed on the bending region BA of the display module DM. Accordingly, the bending protective layer BPL may be disposed in an upper portion of the second portion TL-S2 which is disposed in the bending region BA and electrically connects the first portion TL-S1 of the plurality of sensing lines TL-1, TL-2, and TL-3 and the sensing pad PD. An upper surface of the second portion TL-S2 may be covered by the bending protective layer BPL. For example, the bending protective layer BPL may contact the upper surface of the second portion TL-S2. In the input sensing unit of an embodiment, a separate insulation layer is not included on the second portion TL-S2 which is included in the second sensing conductive layer, but the bending protective layer BPL is disposed on the second portion TL-S2 to cover the upper surface of the second portion TL-S2, so that short circuits may be prevented.

Referring to FIG. 5, FIG. 9, FIG. 10A, and FIG. 10B together, the input sensing unit ISU may further include the dummy line DML disposed adjacent to some of the plurality of sensing lines TL-1, TL-2, and TL-3. In an embodiment, the dummy line DML includes a conductive material. The dummy line DML may overlap the bending region BA, and may be disposed adjacent to the second portion TL-S2. The dummy line DML may be next to and spaced apart from the second portion TL-S2. Like the second portion TL-S2, the dummy line DML may be disposed on the second sensing insulation layer TIL2. For example, the dummy line DML may contact an upper surface of the second sensing insulation layer TIL2. The second portion TL-S2 is electrically connected to the first portion TL-S1 through the input contact hole CNT-I1, but the dummy line DML may be disposed on the second sensing insulation layer TIL2 without being electrically connected to other components. Like the second portion TL-S2, the dummy line DML may be covered by the bending protective layer BPL disposed to overlap the bending region BA. For example, the bending protective layer BPL may contact and cover an entire upper surface of the dummy line DML. The dummy line DML may include several portions that are spaced apart from one another.

In the input sensing unit included in the display device of an embodiment, although the second sensing conductive layer does not include separate insulation layers disposed thereon, the second portion TL-S2 included in the second sensing conductive layer is covered by the bending protective layer BPL, so that defects such as short circuits may be prevented. However, since the second portion TL-S2 contacts the bending protective layer BPL, the second portion TL-S2 may become corroded due to an organic material of the bending protective layer BPL.

In the input sensing unit of an embodiment, the dummy line DML is disposed adjacent to the second portion TL-S2, and like the second portion T1-S2, the dummy line DML is included in the second sensing conductive layer disposed on the second sensing insulation layer TIL2. In addition, the dummy line DML may be disposed at an outer periphery portion which is most vulnerable to corrosion defects in the bending region BA. Accordingly, corrosion of the second portion TL-S2 may be prevented, and the reliability of a display device including the input sensing unit may be increased.

Meanwhile, FIG. 5, FIG. 10A, FIG. 10B, and the like exemplarily illustrate that two dummy lines DML are disposed on each of the left side and the right side of a portion in which the plurality sensing lines TL-1, TL-2, and TL-3 are disposed, but embodiments of the inventive concept are not limited thereto. The dummy line DML may be provided in a suitable number for preventing corrosion defects. For example, 1 to 30 dummy lines DML may be disposed on each of the left side and the right side of a portion in which the plurality sensing lines TL-1, TL-2, and TL-3 are disposed.

As illustrated in FIG. 10A and FIG. 10B, the width of the second portion TL-S2 may be greater than the width of the first portion TL-S1. In the input sensing unit of an embodiment, the width of the second portion TL-S2, which is covered by the bending protective layer BPL, and thus is vulnerable to corrosion, may be designed to be greater than the width of the first portion TL-S1, so that the rate at which the second portion TL-S2 is corroded may be reduced. Accordingly, corrosion of the second portion TL-S2 may be prevented, and the reliability of a display device including the input sensing unit may be increased.

Referring to FIG. 5, FIG. 11, and FIG. 12, the second portion TL-S2 may be connected to the sensing pad PD through the pad contact hole CNT-2 defined in the first sensing insulation layer TIL1 and the second sensing insulation layer TIL2. The sensing pad PD may include a plurality of conductive layers SD1 and SD2, and may be connected to a gate GAT line. The sensing pad PD may be disposed in the above-described input pad unit ISU-PD. The sensing pad PD may be disposed on the base layer BL, and may be disposed on at least some of insulation layers VIA1, VIA1 and VIA3, and may be covered by at least some of the insulation layers VIA1, VIA2 and VIA3. Each of the insulation layers VIA1, VIA2 and VIA3 may correspond to at least one of a plurality of insulation layers included in the circuit element layer DP-CL described with reference to FIG. 3B.

In an embodiment, a taper angle of the pad contact hole CNT-2 defined on the second sensing insulation layer TIL2 ranges from approximately 60 degrees to approximately 75 degrees. For example, the taper angle of the pad contact hole CNT-2 may range from approximately 61 degrees to approximately 72 degrees. In an embodiment, the taper angle of the pad contact hole CNT-2 is approximately 66.1 degrees. In an embodiment, a taper angle of the pad contact hole CNT-2 ranges from precisely 60 degrees to precisely 75 degrees. For example, the taper angle of the pad contact hole CNT-2 may range from precisely 61 degrees to precisely 72 degrees. In an embodiment, the taper angle of the pad contact hole CNT-2 is precisely 66.1 degrees.

As illustrated in FIG. 5 and FIG. 12, in the second non-bending region NBA2 of the input sensing unit ISU, a first side surface S1 may be defined. The first side surface S1 may be one side surface spaced apart from the bending region BA. In an embodiment, an end of the second sensing insulation layer TIL2 is extended to be aligned with the first side surface S1. That is, the second sensing insulation layer TIL2 may have an extended shape to correspond to the first side surface S1 of the input sensing unit ISU. In the input sensing unit of an embodiment, since an end of the second sensing insulation layer TIL2 including an organic film is extended to be aligned with the first side surface S1, in the process of bonding the driving circuit DC to the sensing pad PD through an anisotropic conductive film ACF (see FIG. 2B), it is possible to prevent defects such as short circuits caused by the compression of a conductive ball included in the anisotropic conductive film. Accordingly, the reliability of a display device including the input sensing unit may be increased.

According to a display device of an embodiment of the inventive concept, process steps for the formation of an input sensing unit may be simplified, and the occurrence of short circuits of electrodes and lines included in the input sensing unit may be prevented. Accordingly, the reliability of the display device may be increased.

Although the inventive concept has been described with reference to embodiments of the inventive concept, it will be understood by those skilled in the art that various changes in form and details may be made therein without departing from the spirit and scope of the inventive concept as set forth in the following claims.

What is claimed is:
1. A display device comprising:
a display panel including a display region and a non-display region, and comprising a display element layer which includes light emission elements; and
an input sensing device disposed on the display element layer,
wherein the input sensing device comprises:
a first sensing insulation layer directly disposed on the display panel;
a first sensing conductive layer disposed on the first sensing insulation layer;
a second sensing insulation layer disposed on the first sensing insulation layer and covering the first sensing conductive layer; and
a second sensing conductive layer disposed on the second sensing insulation layer, wherein the second sensing insulation layer includes an organic film, and a first thickness of the first sensing conductive layer is greater than a second thickness of the second sensing conductive layer;
a plurality of sensing patterns overlapping the display region, and arranged in a plurality of rows and a plurality of columns;
a plurality of sensing pads overlapping the non-display region;
a plurality of sensing lines connecting the plurality of sensing patterns and the plurality of sensing pads, respectively, wherein the plurality of sensing patterns are included in the first sensing conductive layer;
a first non-bending region overlapping the display region;
a second non-bending region opposing the first non-bending region; and
a bending region disposed between the first non-bending region and the second non-bending region,
wherein each of the plurality of sensing lines comprises:
a first portion disposed in the first non-bending region; and
a second portion disposed in the bending region and connected to the first portion, wherein the first portion is included in the first sensing conductive layer and the second portion is included in the second sensing conductive layer.

2. The display device of claim 1, wherein the first thickness is approximately 1.5 times to approximately 4.0 times the second thickness.

3. The display device of claim 1, wherein the first thickness is approximately 2000 Å to approximately 4000 Å, and the second thickness is approximately 700 Å to approximately 1500 Å.

4. The display device of claim 1, wherein an upper surface of the second sensing conductive layer defines an uppermost surface of the input sensing unit.

5. The display device of claim 1, wherein the input sensing device further comprises a plurality of connection patterns connecting adjacent sensing patterns among the plurality of sensing patterns, wherein the plurality of connection patterns are included in the second sensing conductive layer.

6. The display device of claim 5, wherein a length of the plurality of connection patterns on a plane is approximately 5 mm or less.

7. The display device of claim 1, wherein the input sensing device further comprises a dummy line disposed adjacent to the second portion of each of the plurality of sensing lines, wherein the dummy line is included in the second sensing conductive layer.

8. The display device of claim 1, wherein the second portion is disposed in a central portion of the bending region, and the dummy line is disposed at an outer periphery portion of the bending region.

9. The display device of claim 1, further comprising a bending protective layer overlapping the bending region, and covering at least a portion of the second portion.

10. The display device of claim 1, wherein a width of the second portion is greater than a width of the first portion.

11. The display device of claim 1, wherein a pad contact hole exposing at least some of the plurality of sensing pads is defined in the second sensing insulation layer, wherein the second portion is electrically connected to the plurality of sensing pads through the pad contact hole.

12. The display device of claim 1, wherein one side spaced apart from the bending region is defined in the second non-bending region, wherein an end of the second sensing insulation layer is aligned with the one side of the second non-bending region.

13. The display device of claim 1, wherein an electrode contact hole exposing at least a portion of the first sensing conductive layer, and overlapping the display region is defined in the second sensing insulation layer, wherein the second sensing conductive layer is electrically connected to the first sensing conductive layer through the electrode contact hole.

14. A display device comprising:
a display panel including a display region and a non-display region; and
an input sensing device disposed on the display panel, the input sensing device comprising:
a first non-bending region overlapping the display region;
a second non-bending region opposing the first non-bending region;
a bending region disposed between the first non-bending region and the second non-bending region;
a first sensing insulation layer directly disposed on the display panel;
a first sensing conductive layer disposed on the first sensing insulation layer;
a second sensing insulation layer disposed on the first sensing insulation layer and covering the first sensing conductive layer;
a second sensing conductive layer disposed on the second sensing insulation layer;
a plurality of sensing electrodes overlapping the display region, and arranged in a plurality of rows and a plurality of columns;
a plurality of sensing pads overlapping the non-display region;
a plurality of sensing lines connecting the plurality of sensing electrodes and the plurality of sensing pads, respectively, where the sensing lines overlap the first non-bending region; and
a dummy line disposed in the bending region adjacent to a portion of a sensing line among the plurality of sensing lines that is disposed in the bending region, wherein the dummy line extends to a boundary of the bending region and the first non-bending region without overlapping the first non-bending region.

15. The display device of claim 14, wherein each of the plurality of sensing lines comprises:
a first portion disposed in the first non-bending region, and included in the first sensing conductive layer; and
a second portion disposed in the bending region and included in the second sensing conductive layer, wherein the dummy line is included in the second sensing conductive layer, and disposed adjacent to the second portion.

16. The display device of claim 14, wherein an upper surface of the second sensing conductive layer defines an uppermost surface of the input sensing device.

17. The display device of claim 14, wherein the plurality of sensing electrodes comprise:
a plurality of sensing patterns arranged in the plurality of rows and the plurality of columns; and a plurality of connection patterns connecting adjacent sensing patterns among the plurality of sensing patterns,
wherein the plurality of connection patterns are included in the second sensing conductive layer.

18. The display device of claim 17, wherein a length of the plurality of connection patterns on a plane is approximately 5 mm or less.

19. A display device comprising:
a display panel including a display region and a non-display region; and
an input sensing device disposed on the display panel, wherein the input sensing device comprises:
a first sensing insulation layer directly disposed on the display panel;
a first sensing conductive layer disposed on the first sensing insulation layer;
a second sensing insulation layer disposed on the first sensing insulation layer and covering the first sensing conductive layer; and
a second sensing conductive layer disposed on the second sensing insulation layer, wherein an upper surface of the second sensing conductive layer defines an uppermost surface of the input sensing device and a light-blocking pattern covers and contacts an exposed surface of a conductive pattern of the second sensing conductive layer, wherein the exposed surface is exposed through an electrode contact hole in the second sensing insulation layer.

* * * * *